(12) United States Patent
Kim et al.

(10) Patent No.: US 10,559,571 B2
(45) Date of Patent: Feb. 11, 2020

(54) METHODS OF FABRICATING SEMICONDUCTOR MEMORY DEVICES

(71) Applicant: Samsung Electronics Co., Ltd., Suwon-si, Gyeonggi-do (KR)

(72) Inventors: Eunjung Kim, Daegu (KR); Daeik Kim, Hwaseong-si (KR); Bong-Soo Kim, Yongin-si (KR); Jemin Park, Suwon-si (KR); Semyeong Jang, Gunpo-si (KR); Yoosang Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 15 days.

(21) Appl. No.: 15/952,350

(22) Filed: Apr. 13, 2018

(65) Prior Publication Data

US 2018/0301459 A1 Oct. 18, 2018

(30) Foreign Application Priority Data

Apr. 13, 2017 (KR) .................. 10-2017-0048085
May 4, 2017 (KR) .................. 10-2017-0056869

(51) Int. Cl.
*H01L 21/02* (2006.01)
*H01L 27/108* (2006.01)
(Continued)

(52) U.S. Cl.
CPC ...... *H01L 27/10855* (2013.01); *B08B 7/0014* (2013.01); *H01L 21/02068* (2013.01);
(Continued)

(58) Field of Classification Search
CPC ......... H01L 21/02068; H01L 21/76805; H01L 21/76814; H01L 21/7687; H01L 21/76895;
(Continued)

(56) References Cited

U.S. PATENT DOCUMENTS 7,582,559 B2 9/2009 Yeo et al.
8,492,250 B2 7/2013 Ko
(Continued)

FOREIGN PATENT DOCUMENTS

JP 20160009801 A 1/2016
KR 20030002734 A 1/2003
(Continued)

*Primary Examiner* — Joseph M Galvin, III
(74) *Attorney, Agent, or Firm* — Harness, Dickey & Pierce, P.L.C.

(57) ABSTRACT

A method of fabricating a semiconductor memory device includes forming a bit line and a bit line capping pattern on the semiconductor substrate, forming a first spacer covering a sidewall of the bit line capping pattern and a sidewall of the bit line, forming a contact plug in contact with a sidewall of the first spacer and having a top surface that is lower than an upper end of the first spacer, removing an upper portion of the first spacer, forming a first sacrificial layer closing at least an entrance of the void, forming a second spacer covering the sidewall of the bit line capping pattern and having a bottom surface in contact with a top surface of the first spacer, and removing the first sacrificial layer. The bit line capping pattern is on the bit line. The contact plug includes a void exposed on the top surface.

20 Claims, 47 Drawing Sheets

(51) Int. Cl.
*H01L 21/768* (2006.01)
*B08B 7/00* (2006.01)

(52) U.S. Cl.
CPC .... *H01L 21/7687* (2013.01); *H01L 21/76805* (2013.01); *H01L 21/76814* (2013.01); *H01L 21/76895* (2013.01); *H01L 27/10885* (2013.01); *H01L 2221/1063* (2013.01)

(58) Field of Classification Search
CPC ......... H01L 27/10808; H01L 27/10855; H01L 27/10885
See application file for complete search history.

(56) References Cited

U.S. PATENT DOCUMENTS

| | | | |
|---|---|---|---|
| 9,245,849 B2 | 1/2016 | Park et al. | |
| 9,379,009 B2 | 6/2016 | Rho | |
| 9,391,138 B2 | 7/2016 | Kim et al. | |
| 9,425,200 B2 | 8/2016 | Hwang et al. | |
| 9,443,730 B2 | 9/2016 | Van Aerde et al. | |
| 9,460,964 B2 | 10/2016 | Kim | |
| 9,543,202 B2 | 1/2017 | Koo et al. | |
| 2006/0088987 A1* | 4/2006 | Yeo | H01L 27/115 438/488 |
| 2015/0185418 A1* | 7/2015 | Chen | G02B 6/136 257/622 |
| 2016/0181264 A1* | 6/2016 | Miyamoto | H01L 27/11524 257/314 |
| 2016/0365279 A1* | 12/2016 | Koo | H01L 21/76895 |
| 2017/0062347 A1* | 3/2017 | Kim | H01L 23/4821 |

FOREIGN PATENT DOCUMENTS

| | | |
|---|---|---|
| KR | 20130092884 A | 8/2013 |
| KR | 20140081547 A | 7/2014 |
| KR | 20150074629 A | 7/2015 |
| KR | 20160057545 A | 5/2016 |

* cited by examiner

METHODS OF FABRICATING SEMICONDUCTOR MEMORY DEVICES

CROSS-REFERENCE TO RELATED APPLICATIONS

This U.S. nonprovisional patent application claims priority under 35 U.S.C. § 119 to Korean Patent Application Nos. 10-2017-0048085 filed on Apr. 13, 2017 and 10-2017-0056869 filed May 4, 2017, the entire contents of which are hereby incorporated by reference.

BACKGROUND

Inventive concepts relate to a method of fabricating a semiconductor memory device.

A semiconductor device may be considered to be an important factor in electronic industry because of its small size, multi-function, and/or low fabrication cost. The semiconductor device is being highly integrated with the remarkable development of the electronic industry. Line widths of patterns of the semiconductor device are being reduced for high integration of the semiconductor device. However, new exposure techniques and/or expensive exposure techniques are required for fineness of the patterns such that it is difficult to highly integrate the semiconductor device. Thus, various researches have recently been conducted for new integration techniques.

SUMMARY

Example embodiments of inventive concepts provide a method of fabricating a semiconductor memory device capable of limiting and/or preventing ohmic layers from being imperfectly formed.

According to example embodiments of inventive concepts, a method of fabricating a semiconductor memory device may include forming on a bit line and a bit line capping pattern on a semiconductor substrate, the bit line capping pattern on the bit line; forming a first spacer covering a sidewall of the bit line capping pattern and a sidewall of the bit line; forming a contact plug in contact with a sidewall of the first spacer, the contact plug having a top surface that is lower than an upper end of the first spacer, the contact plug including a void exposed on the top surface; removing an upper portion of the first spacer; forming a first sacrificial layer that blocks an entrance of the void; forming a second spacer covering the sidewall of the bit line capping pattern, the second spacer having a bottom surface in contact with a top surface of the first spacer; and removing the first sacrificial layer.

According to example embodiments of inventive concepts, a method of fabricating a semiconductor memory device may include forming a bit line and a bit line capping pattern on the semiconductor substrate, the bit line capping pattern on the bit line; forming a first spacer covering a sidewall of the bit line capping pattern and a sidewall of the bit line, the first spacer including a first sub-spacer and a second sub-spacer; forming a contact plug in contact with a sidewall of the first spacer, the contact plug having a top surface that is lower than an upper end of the first spacer; removing an upper portion of the first spacer; removing an upper portion of the contact plug to expose a sidewall of the second sub-spacer; removing an exposed upper portion of the second sub-spacer to expose a sidewall of the first sub-spacer; forming a second spacer covering the sidewall of the bit line capping pattern, the second spacer having a bottom surface in contact with a top surface of the first spacer; and forming a third spacer covering the sidewall of the first sub-spacer.

According to example embodiments of inventive concepts, a method of fabricating a semiconductor memory device may include forming a bit line and a bit line capping pattern on a semiconductor substrate, the bit line capping pattern on the bit line; forming a first spacer covering a sidewall of the bit line capping pattern and a sidewall of the bit line; forming a contact plug in contact with a sidewall of the first spacer, the contact plug having a top surface that is lower than an upper end of the first spacer; removing an upper portion of the first spacer; removing an upper portion of the contact plug to expose an upper part of the sidewall of the first spacer; forming a second spacer covering the sidewall of the bit line capping pattern, the second spacer having a bottom surface in contact with a top surface of the first spacer; forming a protective layer covering at least the upper part of the sidewall of the first spacer; and performing a cleaning process.

BRIEF DESCRIPTION OF THE DRAWINGS

FIGS. 1A to 5A and 7A are plan views illustrating a method of fabricating a semiconductor memory device according to example embodiments of inventive concepts.

FIGS. 1B to 5B and 7B are cross-sectional views taken along line A-A' of FIGS. 1A to 5A and 7A, respectively.

FIGS. 1C to 5C and 7C are cross-sectional views taken along line B-B' of FIGS. 1A to 5A and 7A, respectively.

DETAILED DESCRIPTION

Hereinafter, example embodiments of inventive concepts will be described in detail in conjunction with the accompanying drawings to aid in clearly understanding the present inventive concept.

FIGS. 1A to 5A and 7A are plan views illustrating a method of fabricating a semiconductor memory device according to example embodiments of inventive concepts. FIGS. 1B to 5B and 7B are cross-sectional views taken along line A-A' of FIGS. 1A to 5A and 7A, respectively. FIGS. 1C to 5C and 7C are cross-sectional views taken along line B-B' of FIGS. 1A to 5A and 7A, respectively. FIGS. 6A to 6D are cross-sectional views illustrating a method of fabricating a semiconductor memory device having the cross-section of FIG. 7B.

Figure 1A:
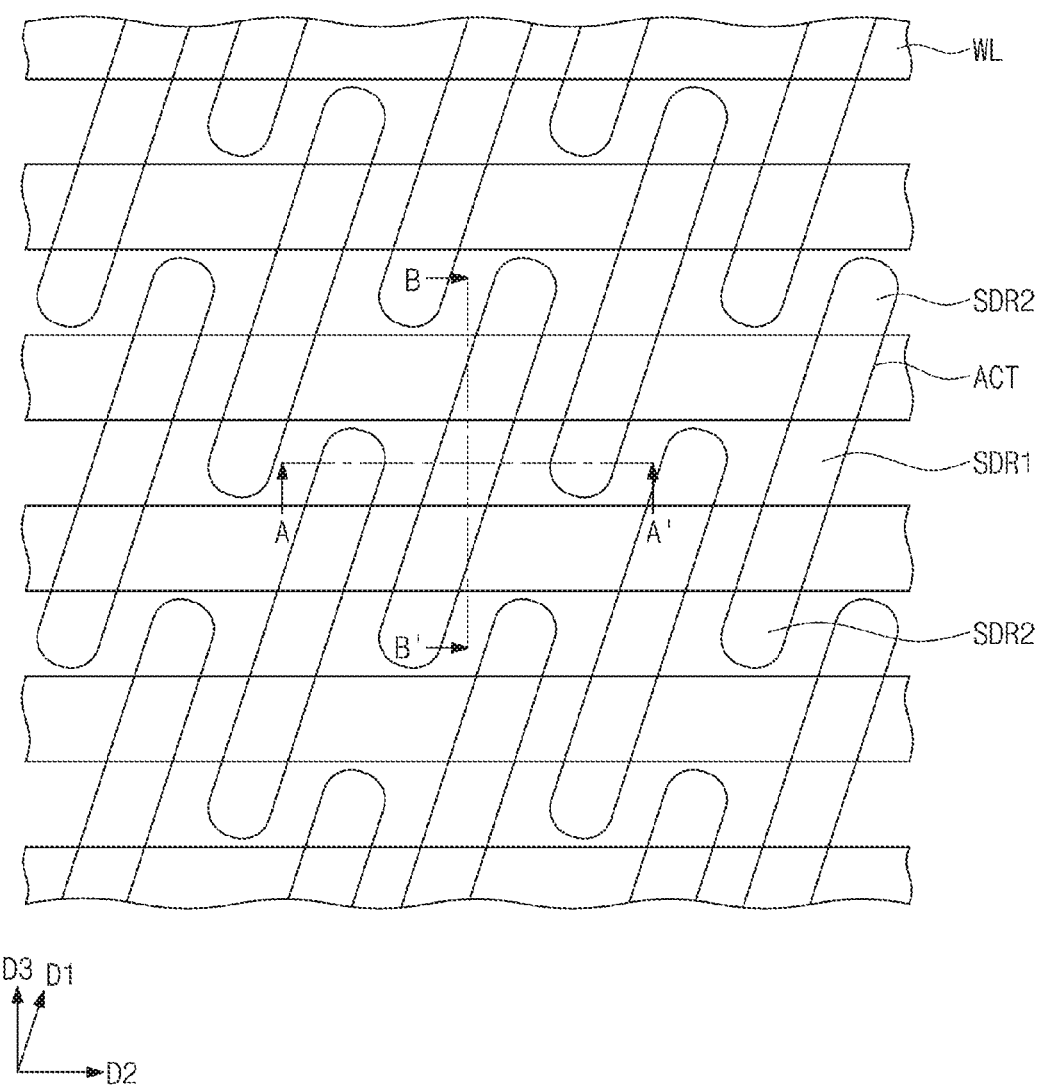
Figure 1B:
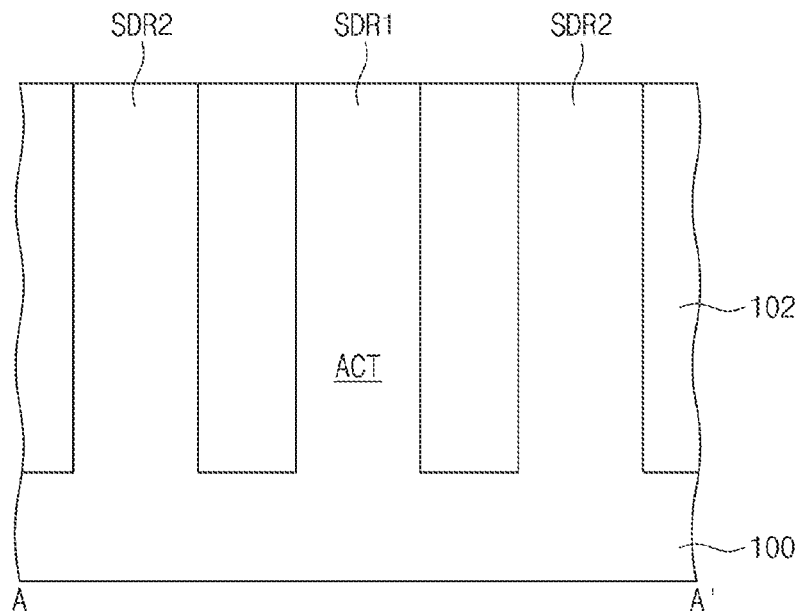
Figure 1C:
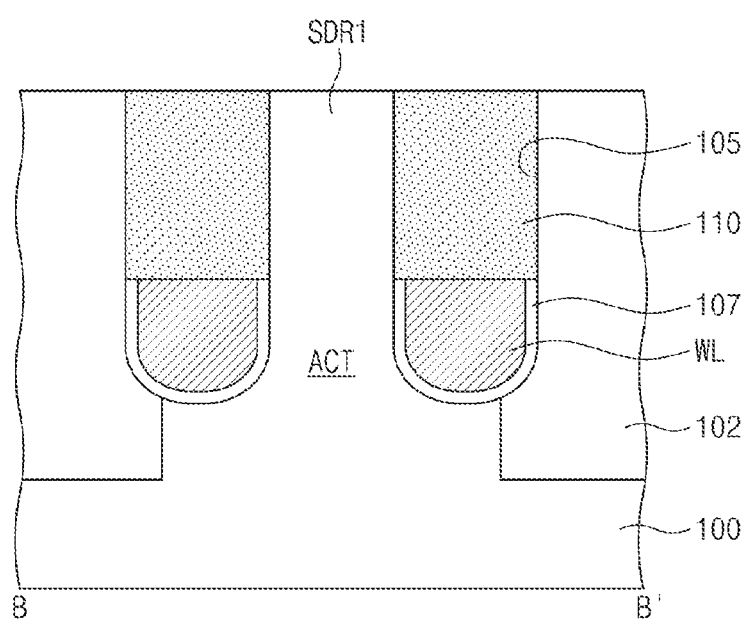

Referring to FIGS. 1A to 1C, device isolation patterns 102 may be formed on a substrate 100 to define active sections ACT. A device isolation trench may be formed on the substrate 100, and the device isolation patterns 102 may fill the device isolation trench. The device isolation patterns 102 may be formed of, for example, one or more of a silicon oxide layer, a silicon nitride layer, and a silicon oxynitride layer. As viewed in plan, the active sections ACT may be arranged in parallel to each other in a first direction D1. The active sections ACT and the device isolation patterns 102 may be patterned to form recessed regions 105. The recessed regions 105 may run across the active sections ACT. A pair of the recessed regions 105 may run across each of the active sections ACT. As shown in FIG. 1A, the pair of the recessed regions 105 may divide each active section ACT into a first source/drain region SDR1 and a pair of second source/drain regions SDR2. The first source/drain region SDR1 may be defined between the pair of the recessed regions 105, and the pair of second source/drain regions SDR2 may be defined on opposite edges of each active section ACT. A gate dielectric layer 107 may be formed on an inner surface of the recessed region 105. The gate dielectric layer 107 may be formed by thermal oxidation, chemical vapor deposition, and/or atomic layer deposition. The gate dielectric layer 107 may be formed of, for example, a silicon oxide layer, a silicon nitride layer, and/or a metal oxide layer. A gate conductive layer may be formed to fill the recessed regions 105, and then etched to form word lines WL within corresponding recessed regions 105. The gate conductive layer may be formed of, for example, impurity-doped polysilicon, metal nitride, and/or metal. The word lines WL may have top surfaces recessed lower than those of the active sections ACT. The word lines WL may be formed to extend in a second direction D2 crossing the first direction D1. An insulation layer such as a silicon nitride layer may be stacked on the substrate 100 to fill the recessed regions 105, and then etched to form word line capping patterns 110 on corresponding word lines WL.

Figure 2A:
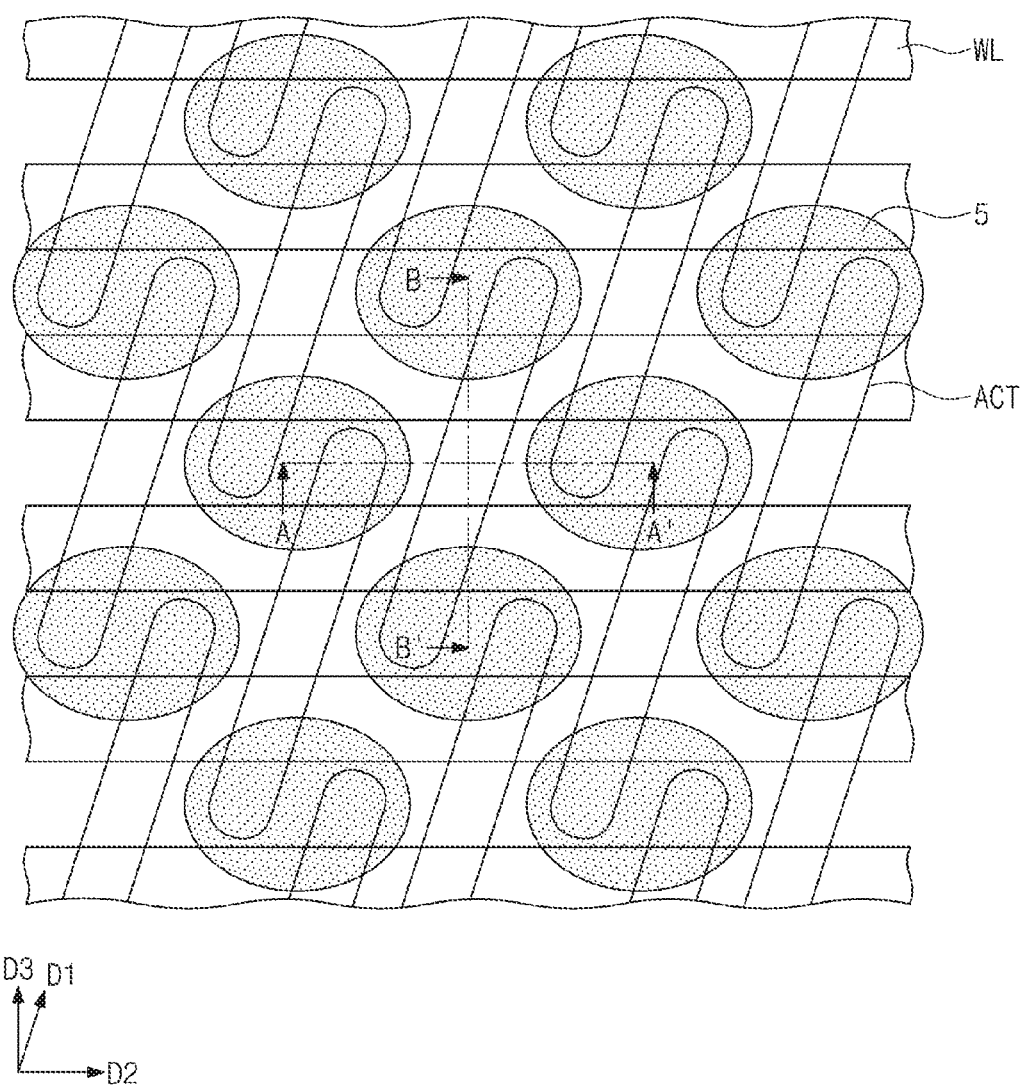
Figure 2B:
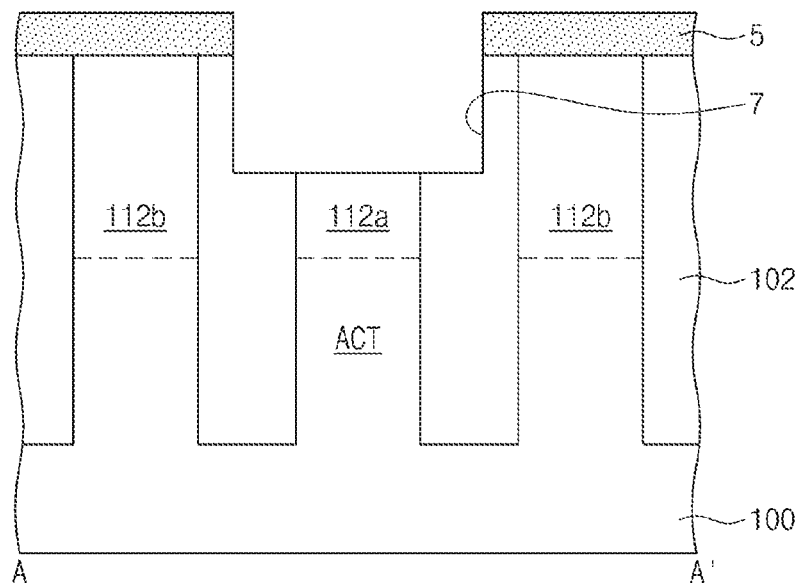
Figure 2C:
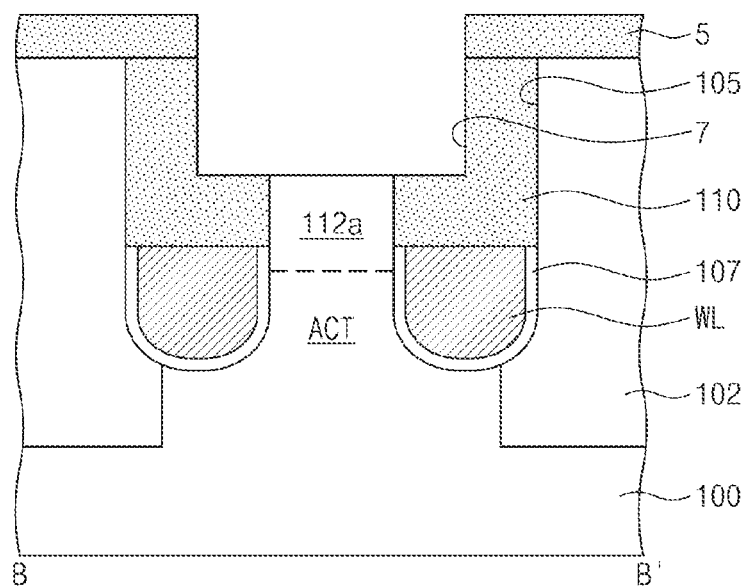

Referring to FIGS. 2A to 2C, the word line capping patterns 110 and the device isolation pattern 102 may be used as a mask to implant a dopant into the active sections ACT, which may form first and second doped regions 112a and 112b. The first doped region 112a and the second doped regions 112b may be formed respectively in the first source/drain region SDR1 and the second source/drain regions SDR2 discussed in FIG. 1A. An insulation layer may be formed on an entire surface of the substrate 100, and then patterned to form a first interlayer dielectric pattern 5. The first interlayer dielectric pattern 5 may be formed of a single layer or multiple layers consisting of (or including) one or more of silicon oxide, silicon nitride, and silicon oxynitride. The first interlayer dielectric pattern 5 may be formed to have a plurality of island shapes spaced apart from each other. The first interlayer dielectric pattern 5 may be formed to simultaneously cover end portions of two neighboring active sections ACT. The first interlayer dielectric pattern 5 may be used as an etch mask to partially etch upper portions of the device isolation patterns 102, an upper portion of the substrate 100, and upper portions of the word line capping patterns 110, which may form a recessed region or a line-contact opening 7. The line-contact opening 7 may be formed to have a net or mesh shape, in a plan view. The line-contact opening 7 may expose the first doped regions 112a.

Figure 3A:
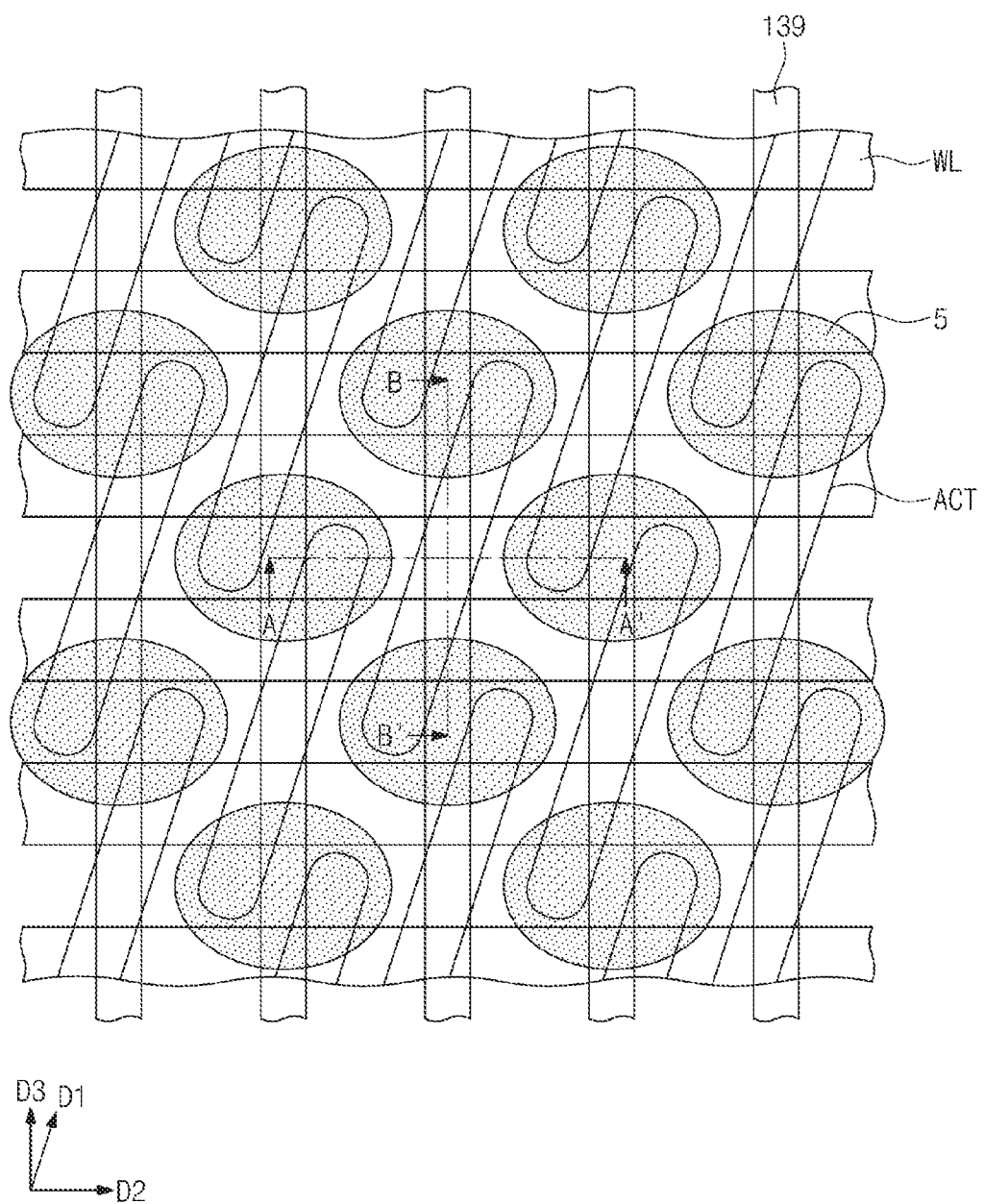
Figure 3B:
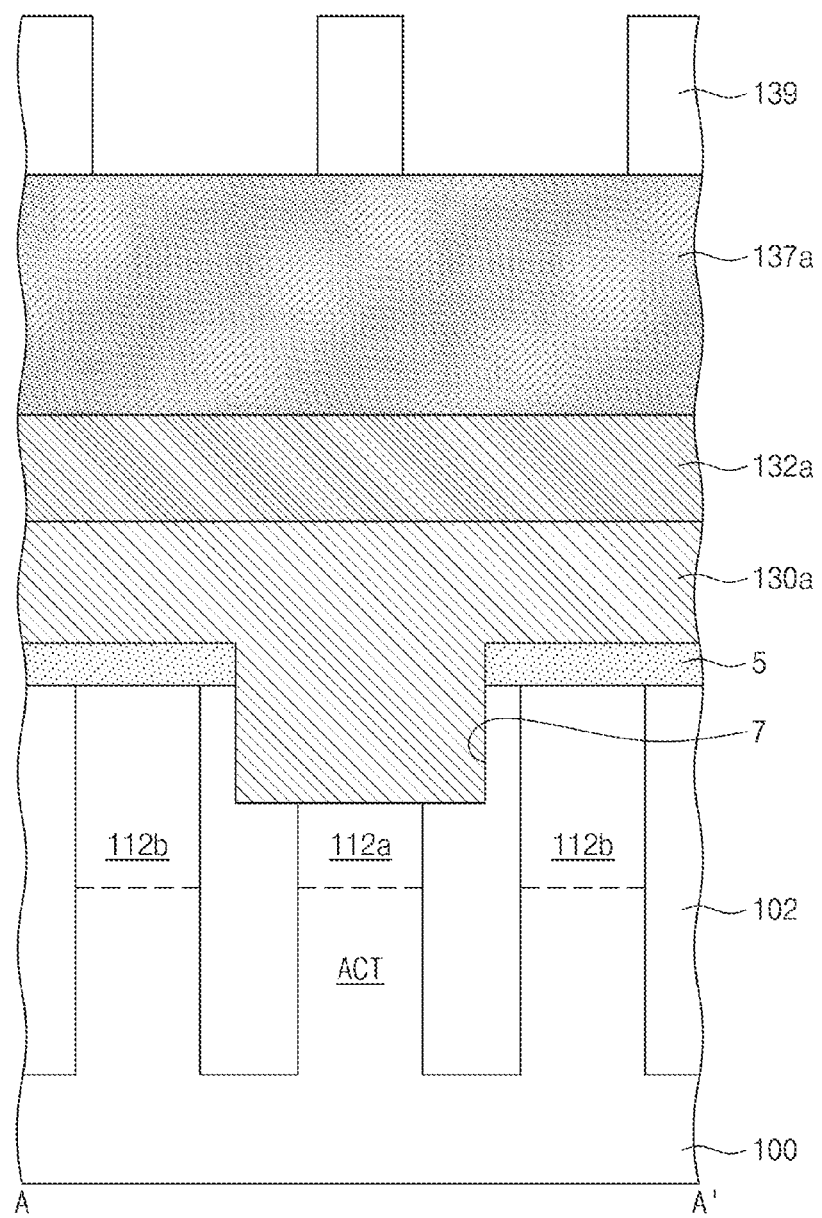
Figure 3C:
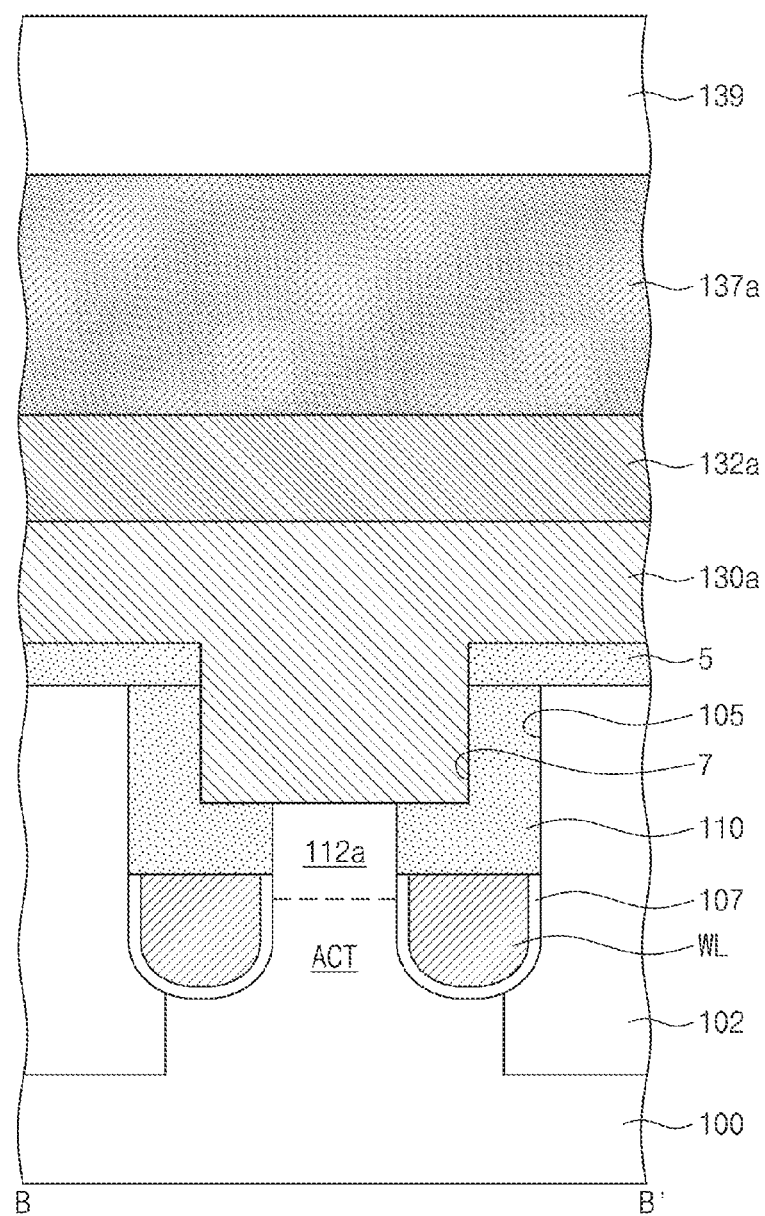

Referring to FIGS. 3A to 3C, a bit line polysilicon layer 130a may be stacked on the entire surface of the substrate 100 to fill the line-contact opening 7. A bit line metal-containing layer 132a and a bit line capping layer 137a may be sequentially stacked on the bit line polysilicon layer 130a. The bit line metal-containing layer 132a may include, for example, a metal nitride layer such as a titanium nitride layer and/or a metal layer such as a tungsten layer. The bit line capping layer 137a may include, for example, a silicon nitride layer. The bit line capping layer 137a may be provided thereon with mask patterns 139 that determine a planar shape of a bit line BL which will be discussed below. The mask patterns 139 may be formed of a material, such as a silicon oxide layer or a photoresist pattern, exhibiting an etch selectivity to the bit line capping layer 137a. The mask patterns 139 may extend in a third direction D3 crossing all of the first and second directions D1 and D2.

Figure 4A:
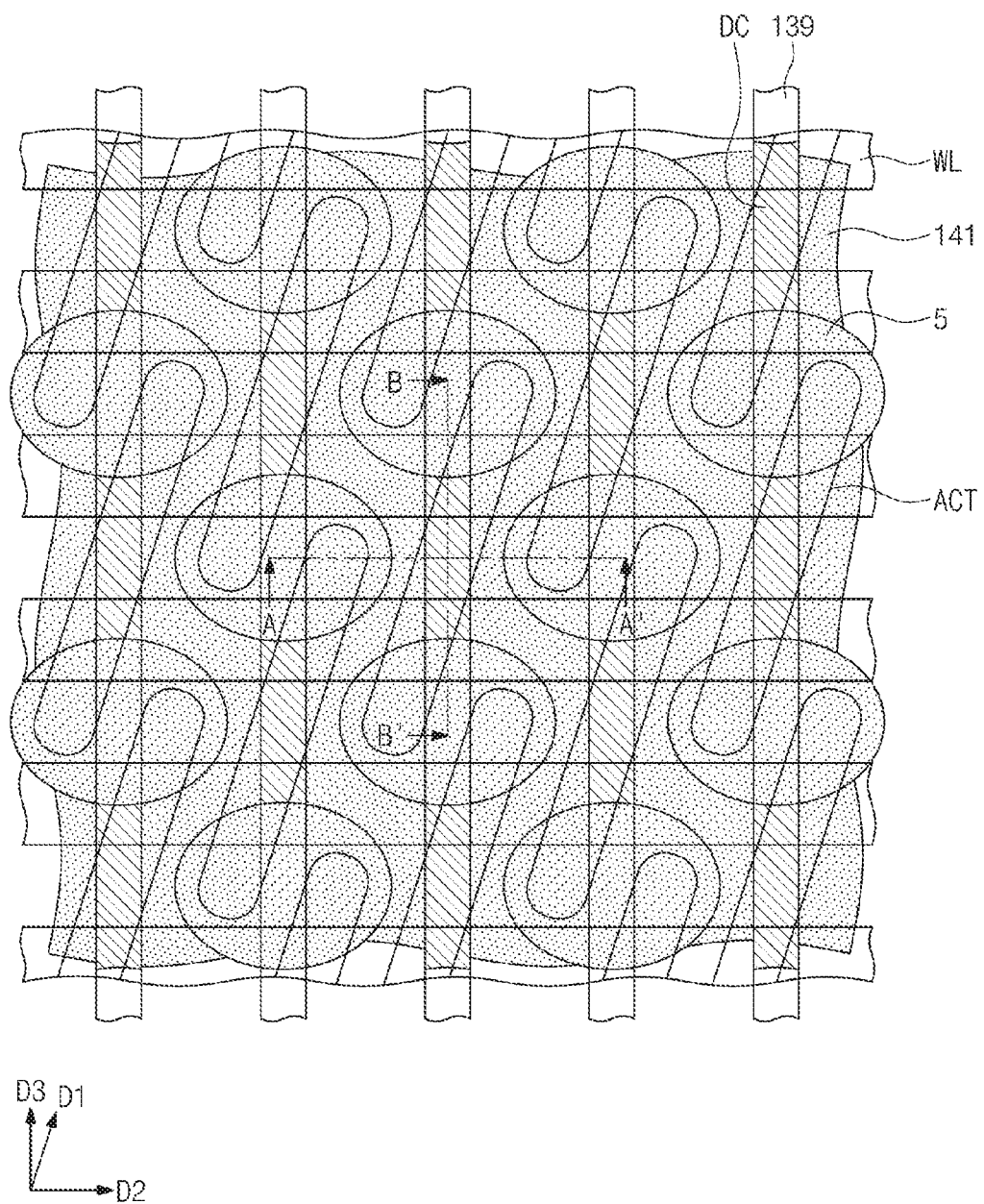
Figure 4B:
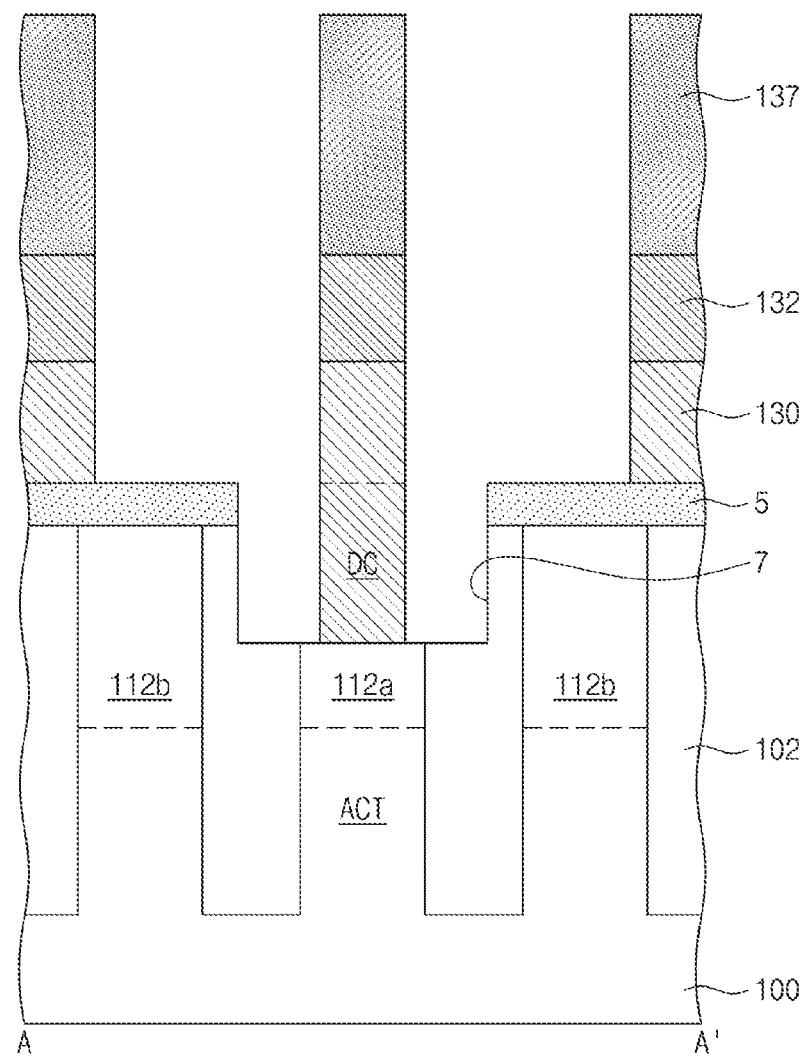
Figure 4C:
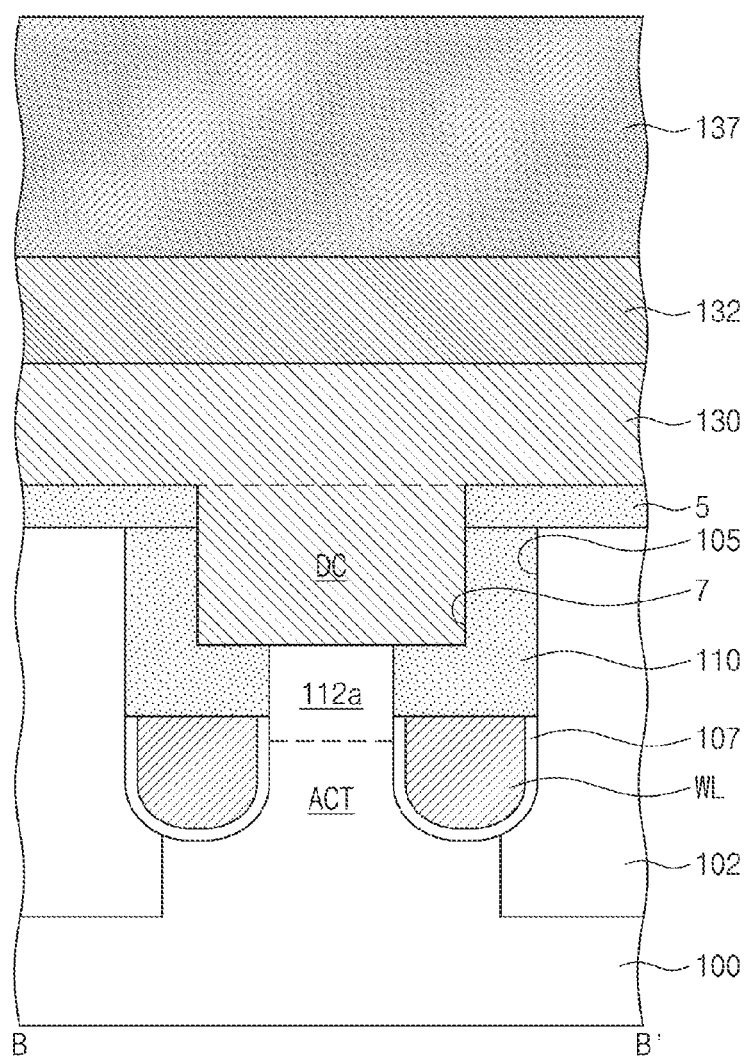

Referring to FIGS. 4A to 4C, the mask patterns 139 may be used as an etch mask to sequentially etch the bit line capping layer 137a, the bit line metal-containing layer 132a, and the bit line polysilicon layer 130a, which may form a bit line BL including a bit line polysilicon pattern 130 and a bit line metal-containing pattern 132, a bit line contact plug DC consisting of (or including) a portion of the bit line polysilicon pattern 130, and a bit line capping pattern 137 transformed from the bit line capping layer 137a. The aforementioned process may partially expose a top surface of the first interlayer dielectric pattern 5, and also partially expose an inner sidewall and a floor surface of the line-contact opening 7. The mask patterns 139 may be removed.

Figure 5A:
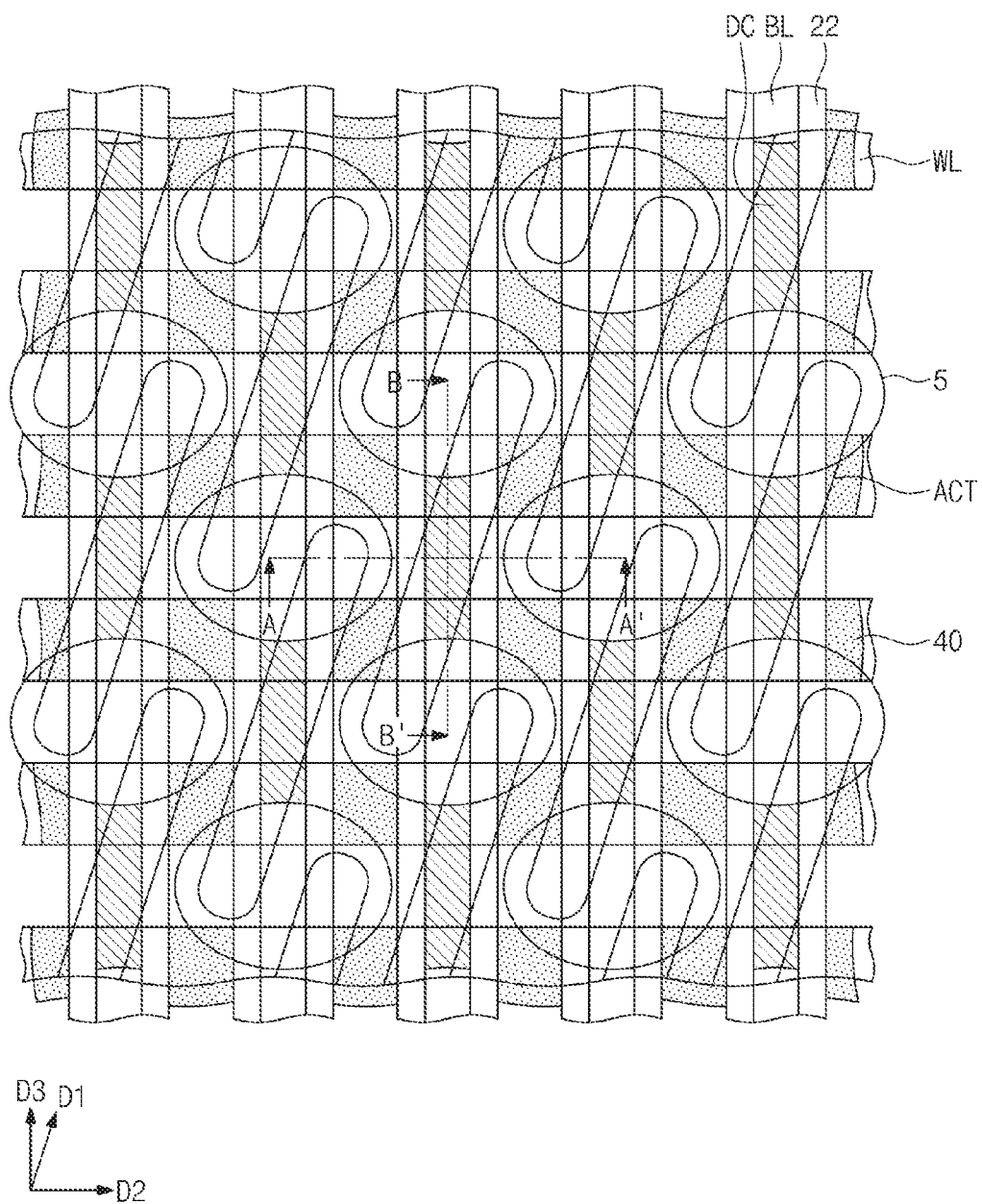
Figure 5B:
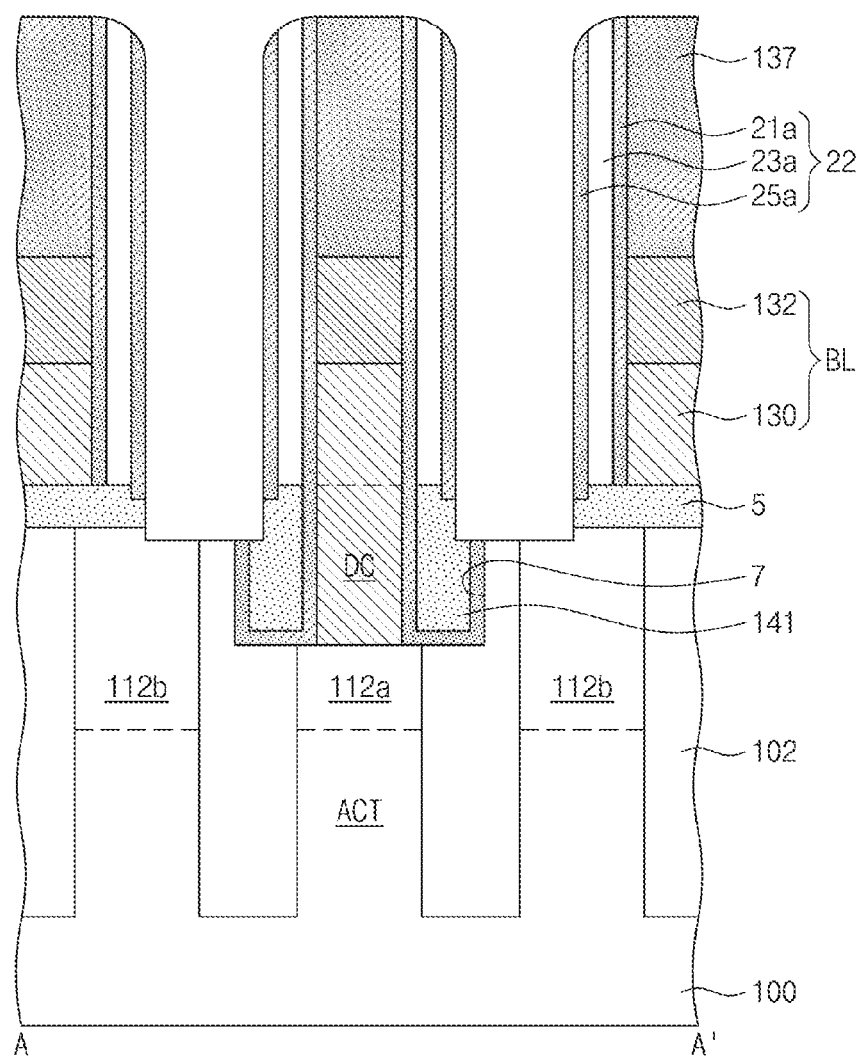
Figure 5C:
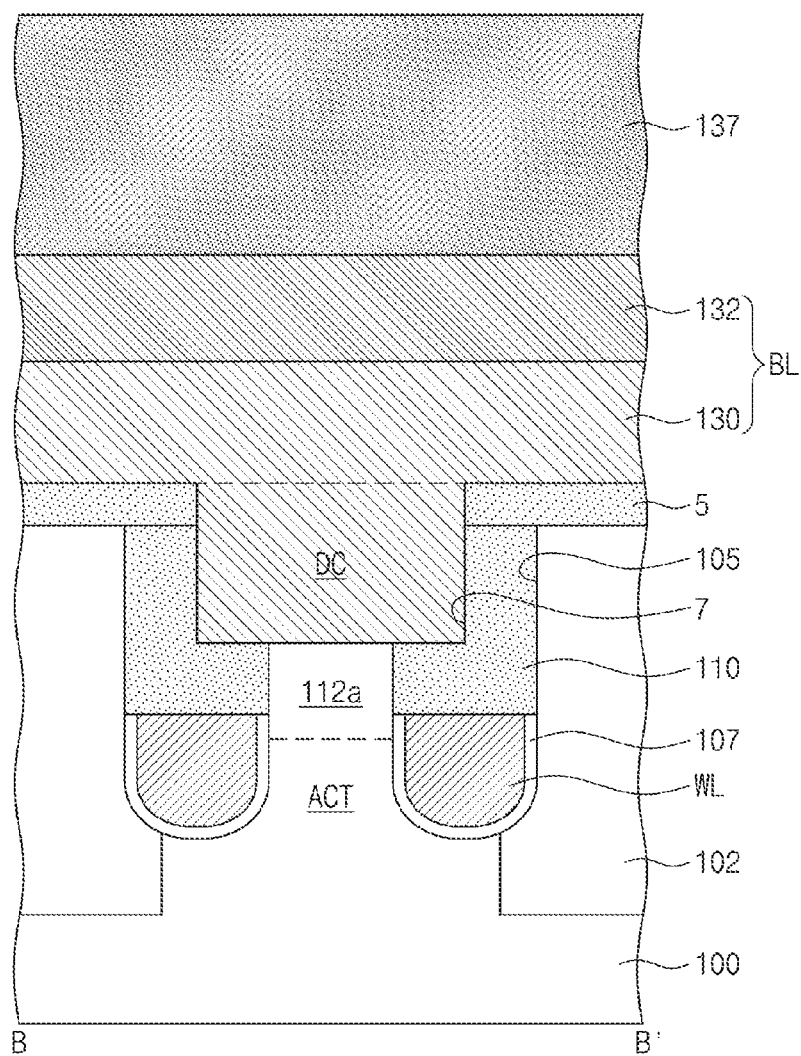

Referring to FIGS. 5A to 5C, a first sub-spacer layer consisting of (or including), for example, a silicon nitride layer, may be conformally formed on the entire surface of the substrate 100. The first sub-spacer layer may conformally cover the floor surface and the inner sidewall of the line-contact opening 7. An insulation layer, for example, a silicon nitride layer, may be stacked on the entire surface of the substrate 100 to fill between the bit line contact plug DC and the inner sidewall of the line-contact opening 7, and then an anisotropic etching process may be performed to form a first sub-spacer 21a and an insulation spacer 141 within the line-contact opening 7. A second sub-spacer layer consisting of (or including), for example, a silicon nitride layer, may be conformally formed on the entire surface of the substrate 100, and then anisotropically etched to form a second sub-spacer 23a. A third sub-spacer layer consisting of (or including), for example, a silicon nitride layer, may be conformally formed on the entire surface of the substrate 100, and then anisotropically etched to form a third sub-spacer 25a. A first spacer 22 may be constituted by the first sub-spacer 21a, the second sub-spacer 23a, and the third sub-spacer 25a. The first interlayer dielectric pattern 5 may be exposed between the first spacers 22. The exposed first interlayer dielectric pattern 5 may be etched to expose the second doped region 112b of the substrate 100. An insulation layer, for example, a silicon nitride layer, may be stacked on the entire surface of the substrate 100, and then patterned to form a storage node isolation pattern 40 defining a storage node contact hole between the first spacers 22. The storage node isolation pattern 40 may be formed of, for example, a silicon nitride layer. The storage node isolation pattern 40 may have a top surface at the same height as that of a top surface of the bit line capping pattern 137.

Figure 6A:
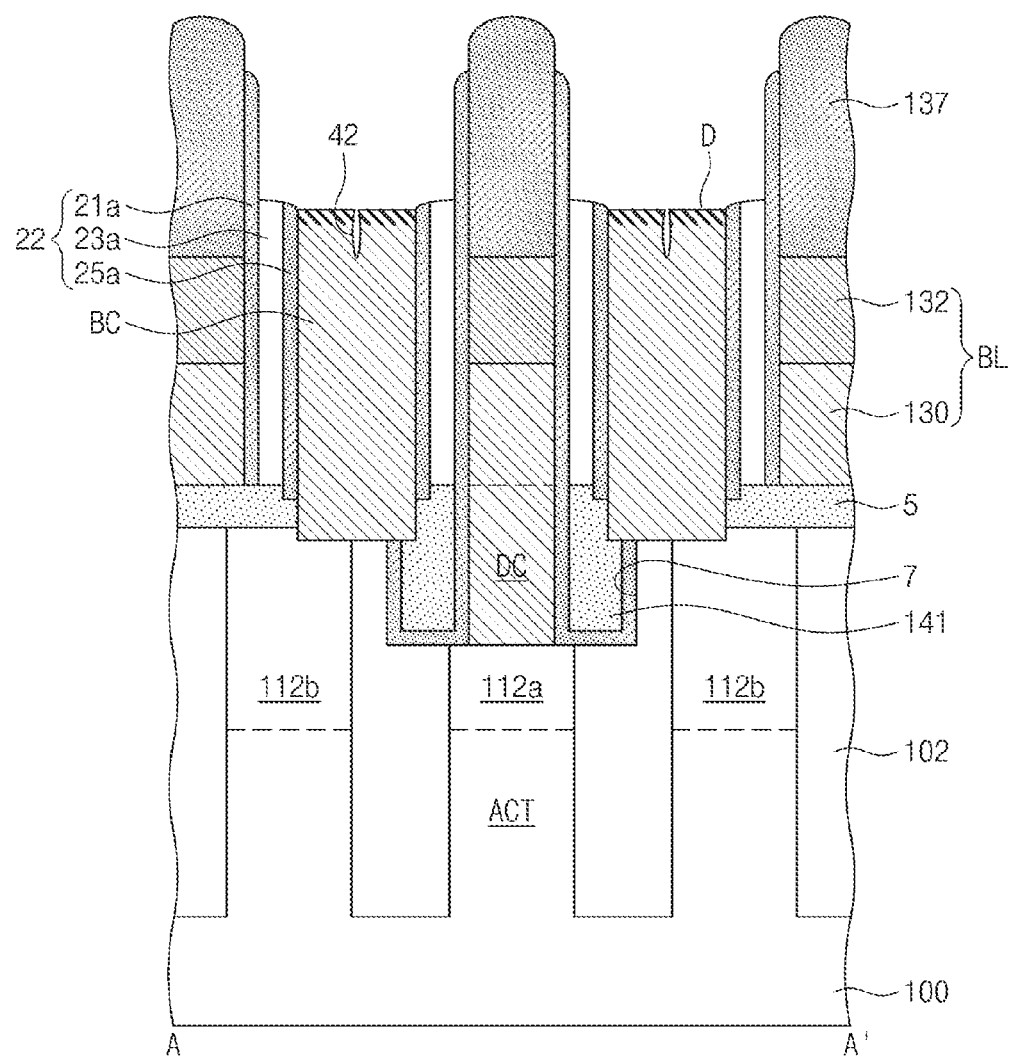
FIGS. 6A to 6D are cross-sectional views illustrating a method of fabricating a semiconductor memory device having the cross-section of FIG. 7B.

Referring to FIG. 6A, an impurity-doped polysilicon layer may be stacked on the entire surface of the substrate 100 having the storage node isolation pattern 40 formed thereon. An etching process may be performed to form between neighboring first spacers 22 a storage node contact plug BC, whose top surface is lower than that of the bit line capping pattern 137. When the polysilicon layer is stacked, a narrow spacing between the first spacers 22 may accelerate occurrence of a seam or void 42 on or in the storage node contact plug BC. The etching process may cause the void 42 to appear on the top surface of the storage node contact plug BC. An etching process may be performed such that the second and third sub-spacers 23a and 25a are removed at their portions whose side surfaces are not covered with the storage node contact plug BC, thereby exposing an upper sidewall of the first sub-spacer 21a. The etching processes may create an etching damage D on the top surface of the storage node contact plug BC.

When a subsequent process is performed to form a second spacer (see 27a of FIG. 6C) under a condition that the void 42 is still exposed, a layer (e.g., a silicon nitride layer) constituting the second spacer 27a may remain in the void 42. In this case, when the storage node contact plug BC is provided on its top surface with an ohmic layer consisting of (or including) metal silicide, the ohmic layer may not be formed on the silicon nitride layer remaining in the void 42. It thus may be difficult to obtain a perfect ohmic contact. According to the present inventive concept, the following processes are performed to limit and/or prevent an imperfect ohmic contact.

Figure 6B:
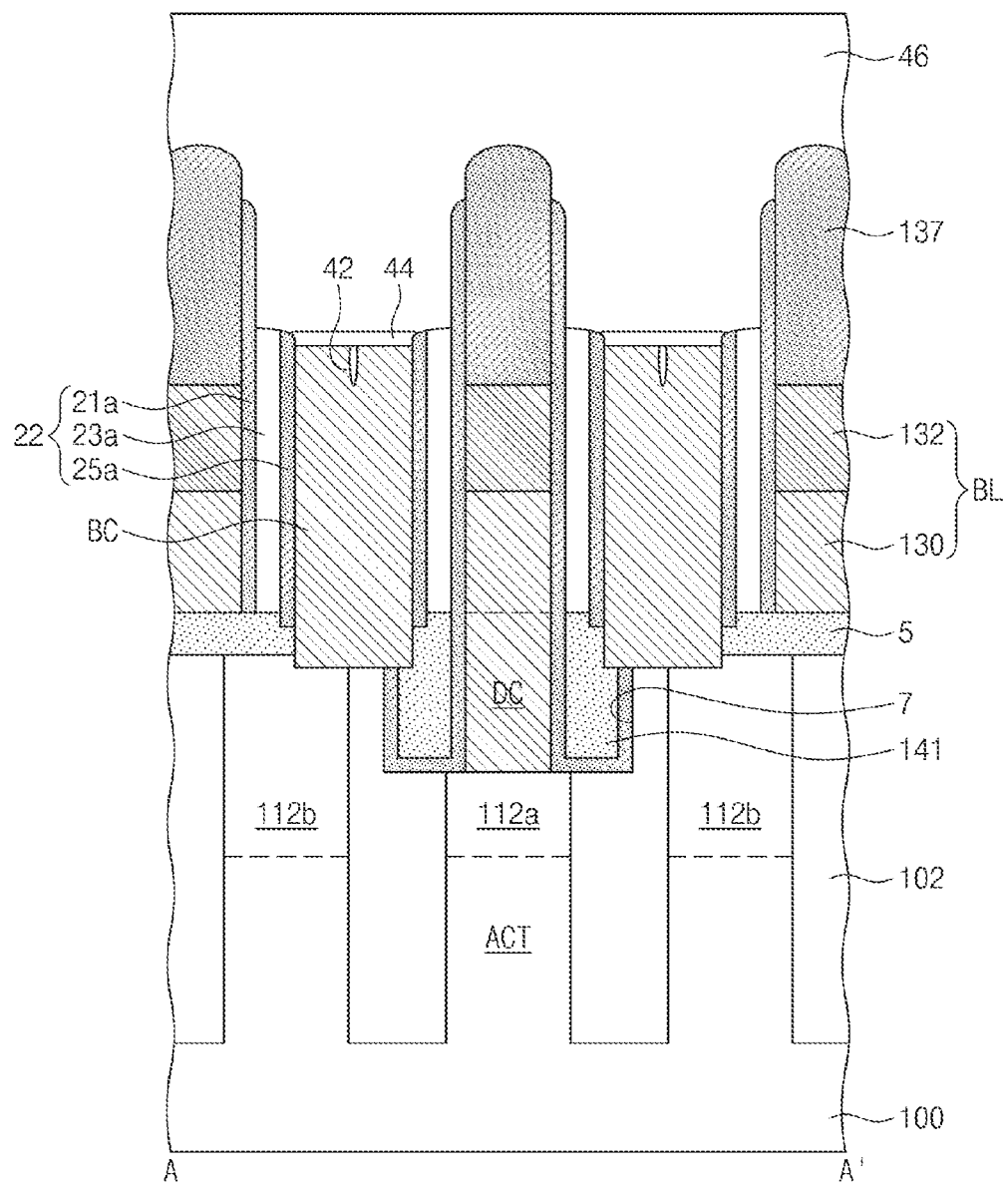

Referring to FIG. 6B, the entire surface of the substrate 100 shown in FIG. 6A may be coated by a solution including oxygen and carbon, and then the solution may be cured to be changed into a sacrificial layer 46. For example, the sacrificial layer 46 may be one of a spin-on-hardmask (SOH) layer, a spin-on-carbon (SOC) layer, and a photoresist layer. When the solution is cured, oxygen contained in the solution may combine with the etching damage D of the storage node contact plug BC to form an oxide layer 44. For example, the oxide layer 44 may be formed at an interface between the sacrificial layer 46 and the storage node contact plug BC. The oxide layer 44 may be formed to block an entrance of the void 42. The solution may have difficulty in entering the void 42, and thus no oxide layer 44 may be formed in the void 42.

Figure 6C:
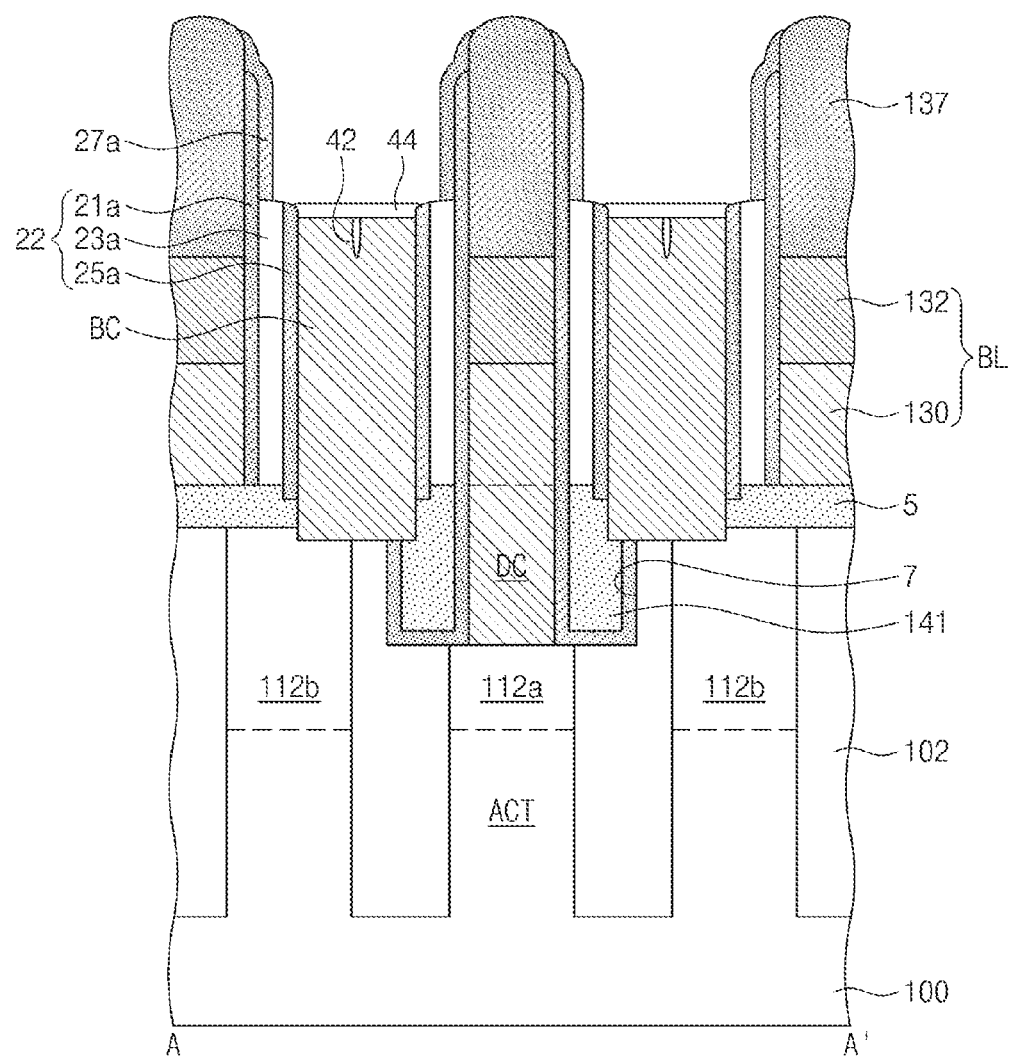

Referring to FIG. 6C, the sacrificial layer 46 may be removed to expose the oxide layer 44. The sacrificial layer 46 may be removed by, for example, an ashing process. A second spacer layer may be conformally formed on the entire surface of the substrate 100 under a condition that the oxide layer 44 is exposed. The second spacer layer may be formed of, for example, a silicon nitride layer. The oxide layer 44 may not allow the second spacer layer to enter the void 42. An anisotropic etching process may be performed on the second spacer layer to expose the oxide layer 44 and at the same time to form a second spacer 27a covering the exposed upper sidewall of the first sub-spacer 21a. The second spacer 27a may be formed to have a width less than a sum of widths of the second and third sub-spacers 23a and 25a. Accordingly, between the bit line capping patterns 137, the second spacers 27a may be spaced at a distance greater than that between the first spacers 22. An increased connecting area may be made between the storage node contact plug BC and a landing pad LP which will be discussed below. In addition, between the bit line capping patterns 137, the distance between the second spacers 27a may be adjusted independently of the distance between the first spacers 22. The second spacer 27a may have a bottom surface in contact with a top surface of the second sub-spacer 23a. The top surface of the second sub-spacer 23a may be partially exposed without being covered with the second spacer 27a.

Figure 6D:
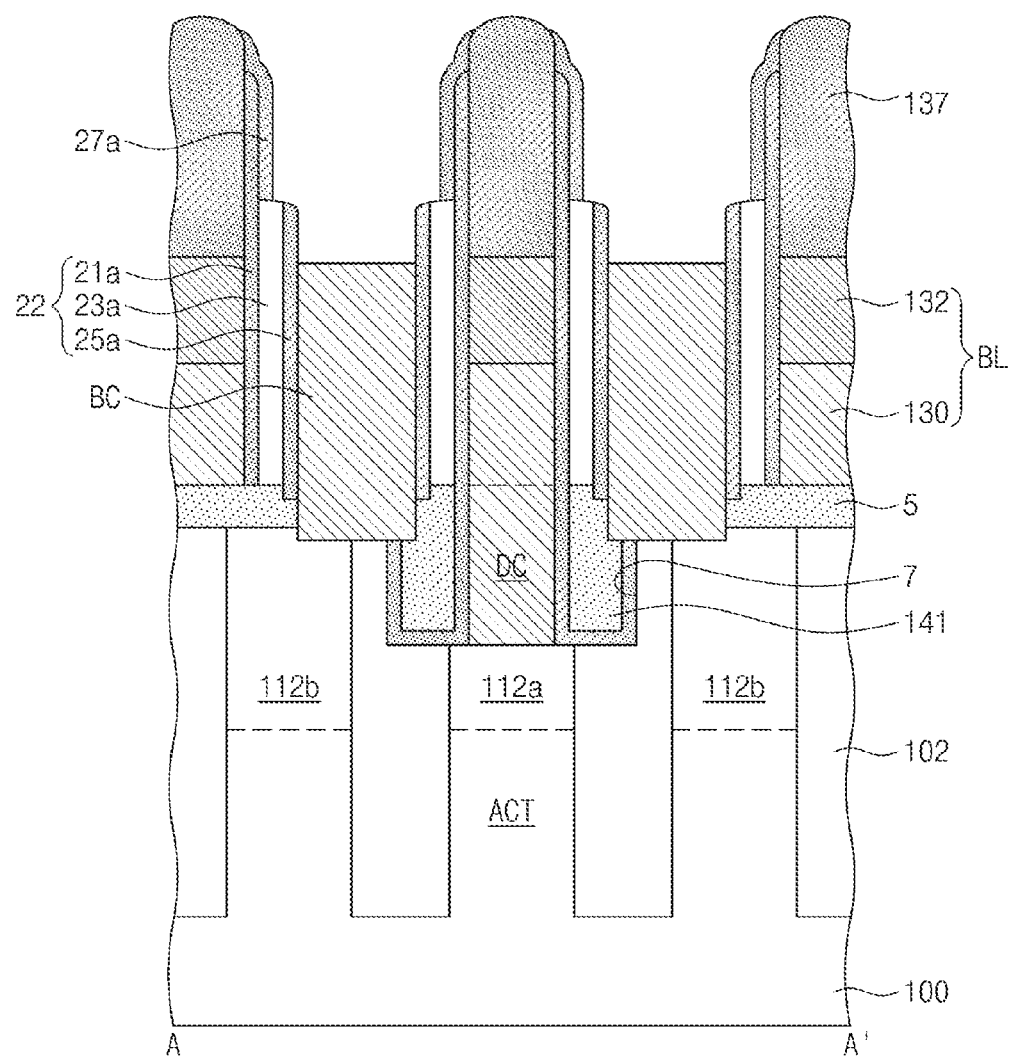

Referring to FIG. 6D, the second spacer 27a and the bit line capping pattern 137 may be used as an etch mask to remove the oxide layer 44, which may expose the storage node contact plug BC. An upper portion of the storage node contact plug BC may be removed. In this operation, the void 42 may also be removed.

Figure 7A:
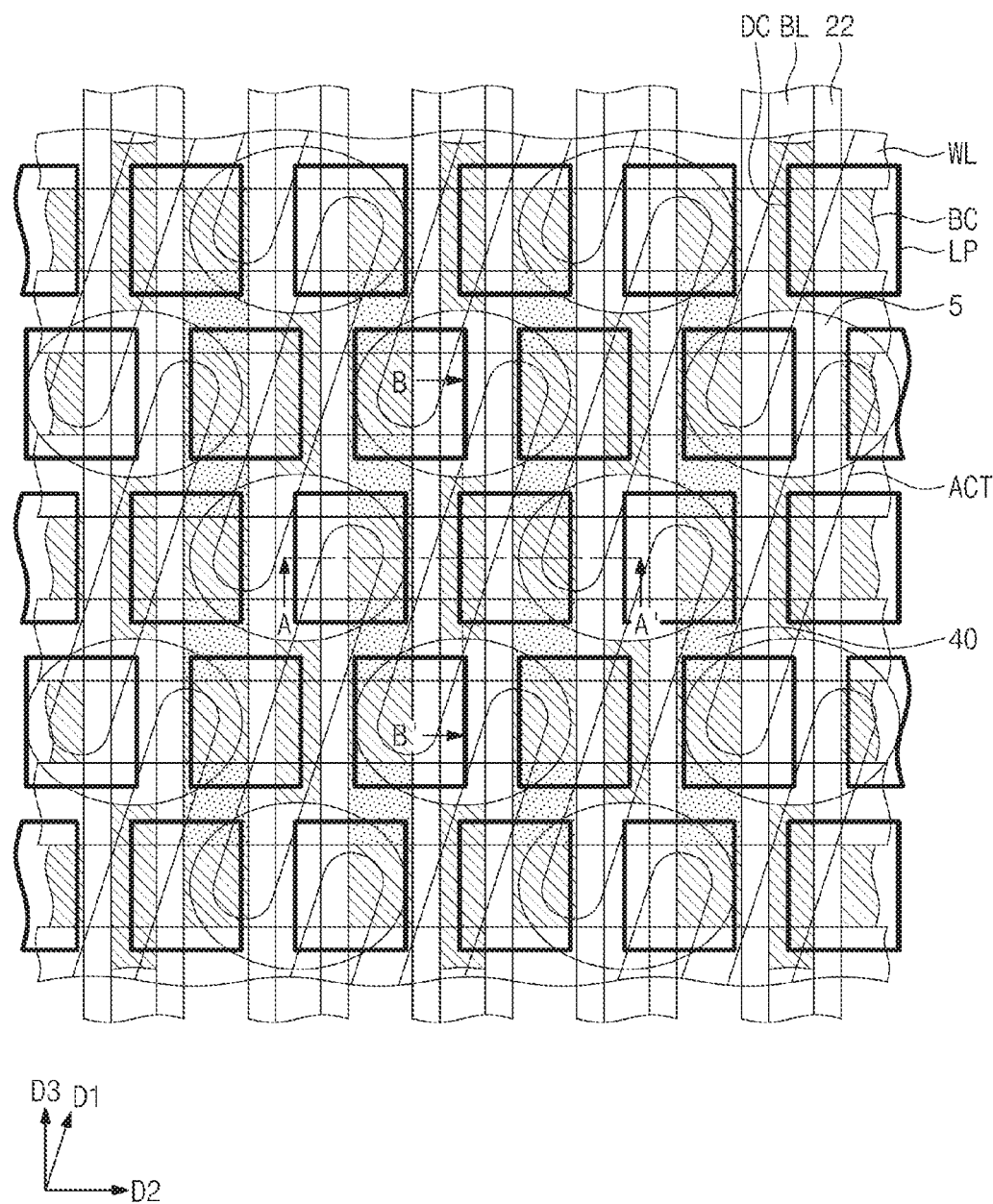
Figure 7B:
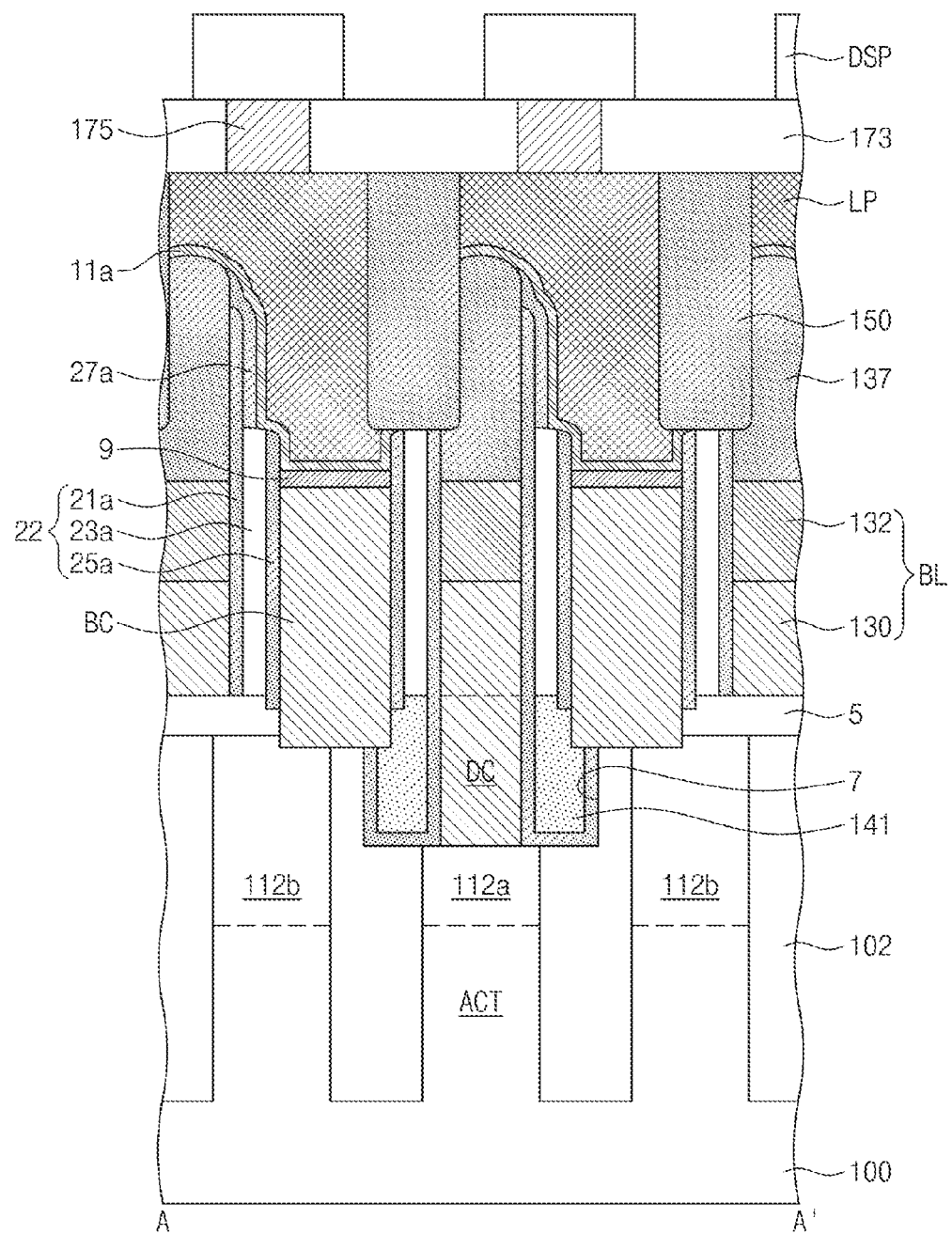
Figure 7C:
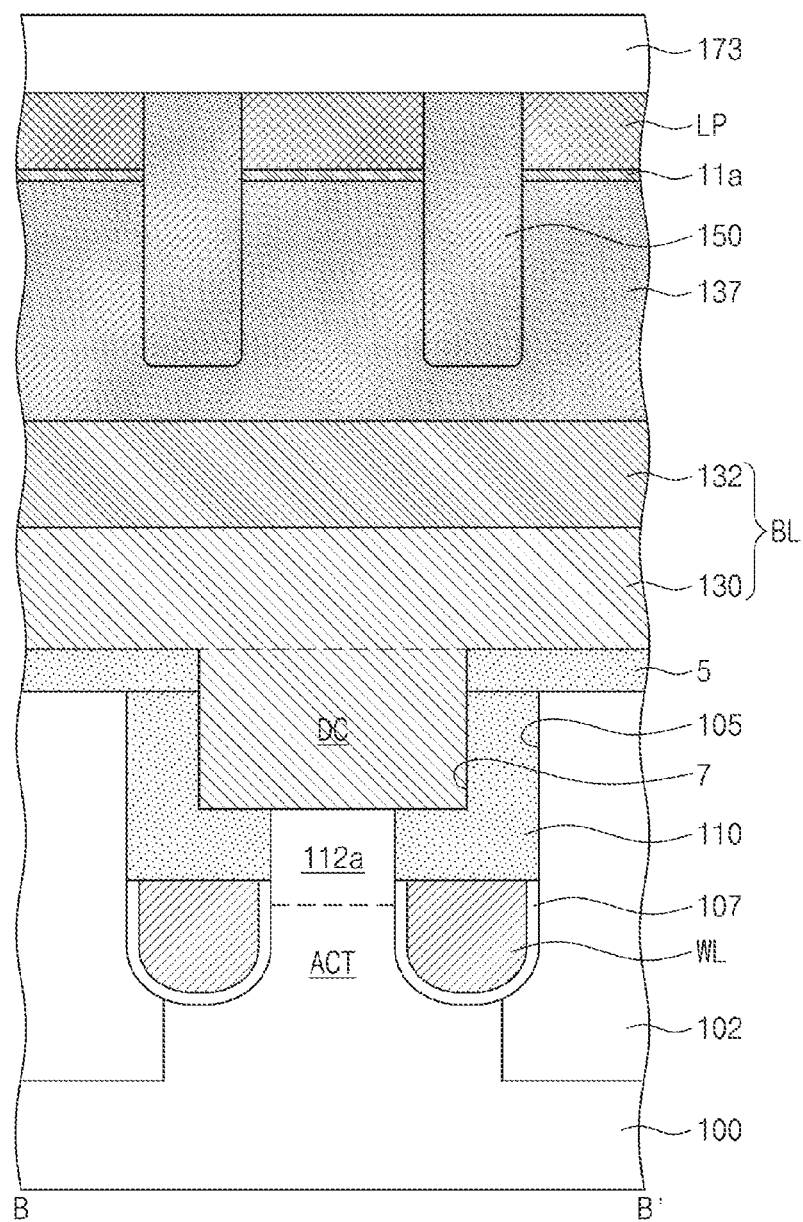

Referring to FIGS. 7A to 7C, the substrate 100 may be covered on its entire surface with a protective layer (not shown), and a cleaning process may be performed. The protective layer may be formed of, for example, a silicon nitride layer. The cleaning process may completely remove the protective layer. The protective layer may limit and/or prevent the third sub-spacer 25a from being removed in the cleaning process. The first spacer 22 may thus be protected from damage on its sidewall, and thereby the bit line BL may be sufficiently insulated from the storage node contact plug BC.

A metal layer may be formed on a surface of the storage node contact plug BC. Then, an annealing process may be performed to form on the storage node contact plug BC as an ohmic layer 9 consisting of (or including) a metal silicide layer. In this operation, since the storage node contact plug BC does not have on its surface a silicon nitride layer used for forming the second spacer 27a, the ohmic layer 9 may be perfectly formed.

A diffusion barrier layer such as a titanium nitride layer may be conformally formed on the entire surface of the substrate 100 having the ohmic layer 9 formed thereon. A metal-containing layer such as a tungsten-containing layer may be formed on the diffusion barrier layer. The metal-containing layer, the diffusion barrier layer, and the second spacer 27a on a side of the bit line BL may be sequentially patterned to form diffusion prevention patterns 11a and landing pads LP and also to form a gap region between the landing pads LP. In this operation, the second sub-spacer 23a may be removed to form an air gap. The landing pads LP and the diffusion prevention patterns 11a may each be formed to have an island shape, in a plan view. An insulating material may fill the gap region and then be planarization-etched to form a landing pad isolation pattern 150 that separates the lading pads LP from each other. A material such as an oxide layer may be used to form a second interlayer dielectric layer 173 on the landing pad LP and the landing pad isolation pattern 150. A via plug 175 may be formed to penetrate the second interlayer dielectric layer 173 and to make contact with the landing pad LP. The via plug 175 may be formed of a conductive material such as an impurity-doped polysilicon layer or a metal-containing layer. The second interlayer dielectric layer 173 may be provided thereon with a data storage part DSP in contact with the via plug 175. The data storage part DSP may be a capacitor including a bottom electrode, a dielectric layer, and a top electrode. Alternatively, the data storage part DSP may include a magnetic tunnel junction pattern. Dissimilarly, the data storage part DSP may include a phase change material or a variable resistance material.

FIGS. 8A to 8F are cross-sectional views illustrating a method of fabricating a semiconductor memory device according to example embodiments of inventive concepts.

Figure 8A:
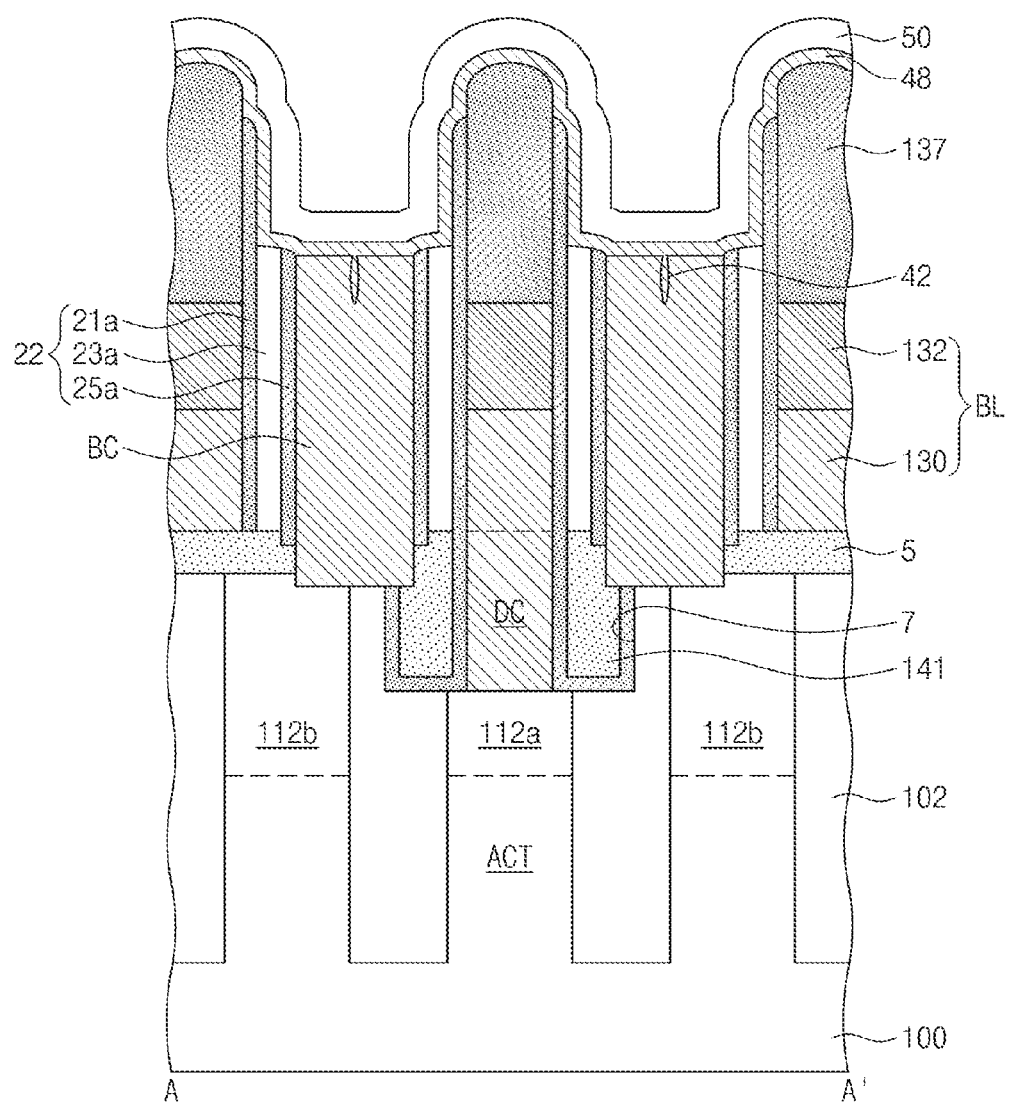
FIGS. 8A to 8F are cross-sectional views sequentially illustrating a method of fabricating a semiconductor memory device according to example embodiments of inventive concepts.

Referring to FIG. 8A, the void 42 may be filled with a first sacrificial layer 48 that is conformally formed on the entire surface of the substrate 100 shown in FIG. 6A. The first sacrificial layer 48 may be formed of the same material as that of the storage node contact plug BC or formed of a material exhibiting the same etch selectivity as that of the storage node contact plug BC. The first sacrificial layer 48 may be formed of, for example, a polysilicon layer or a silicon-germanium layer. A second sacrificial layer 50 may be conformally formed on the first sacrificial layer 48. The second sacrificial layer 50 may be formed of a material exhibiting an etch selectivity to the first sacrificial layer 48. The second sacrificial layer 50 may be formed of, for example, a silicon oxide layer. The first and second sacrificial layers 48 and 50 may each be formed by a deposition process. A sum of thicknesses of the first and second sacrificial layers 48 and 50 may be the same as or greater than a sum of widths of the second and third sub-spacers 23a and 25a.

Figure 8B:
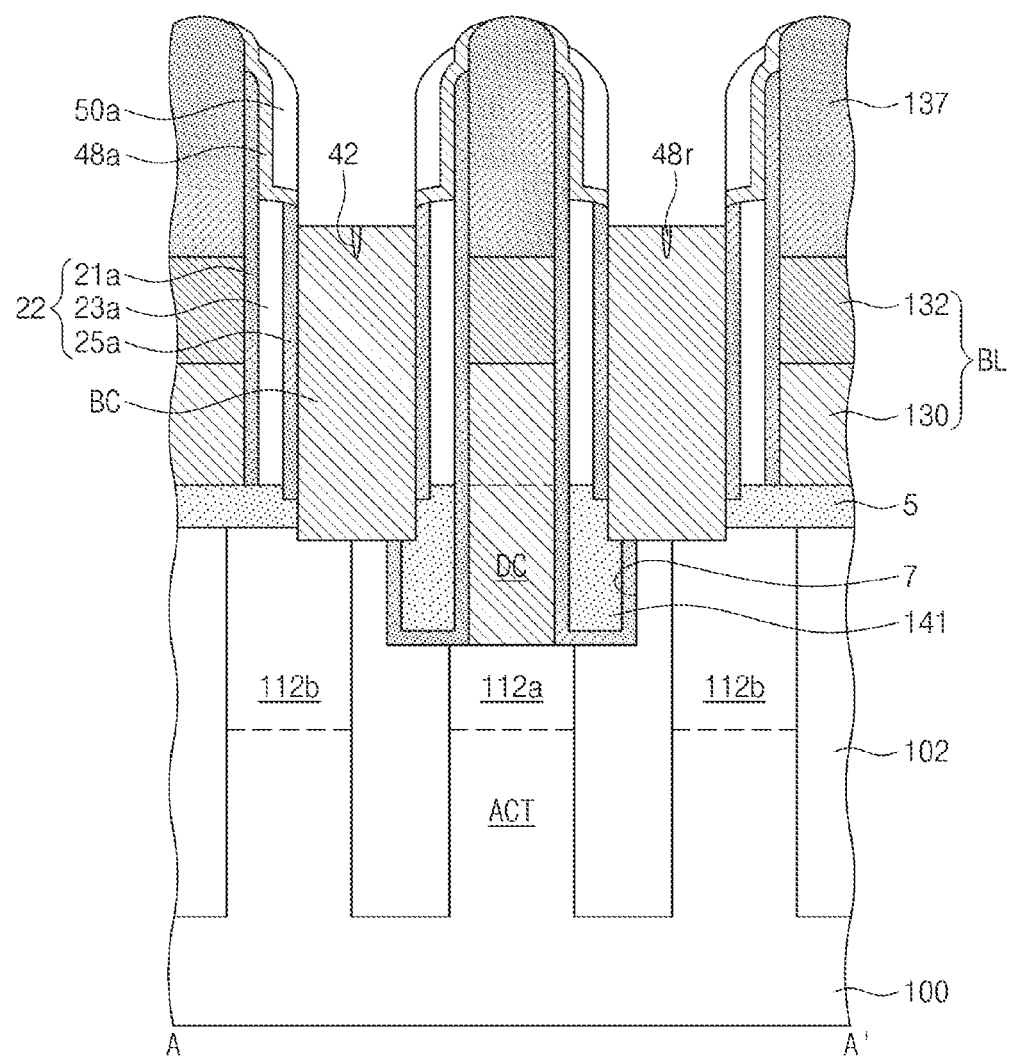

Referring to FIG. 8B, an anisotropic etching process may be performed on the first and second sacrificial layers 48 and 50 to form a first sacrificial spacer 48a and a second sacrificial spacer 50a sequentially covering a side surface of the bit line capping pattern 137 and to expose the top surface of the storage node contact plug BC. In this operation, a first sacrificial residue layer 48r may remain in the void 42. The first sacrificial spacer 48a may be formed to cover top surfaces of the second and third sub-spacers 23a and 25a.

Figure 8C:
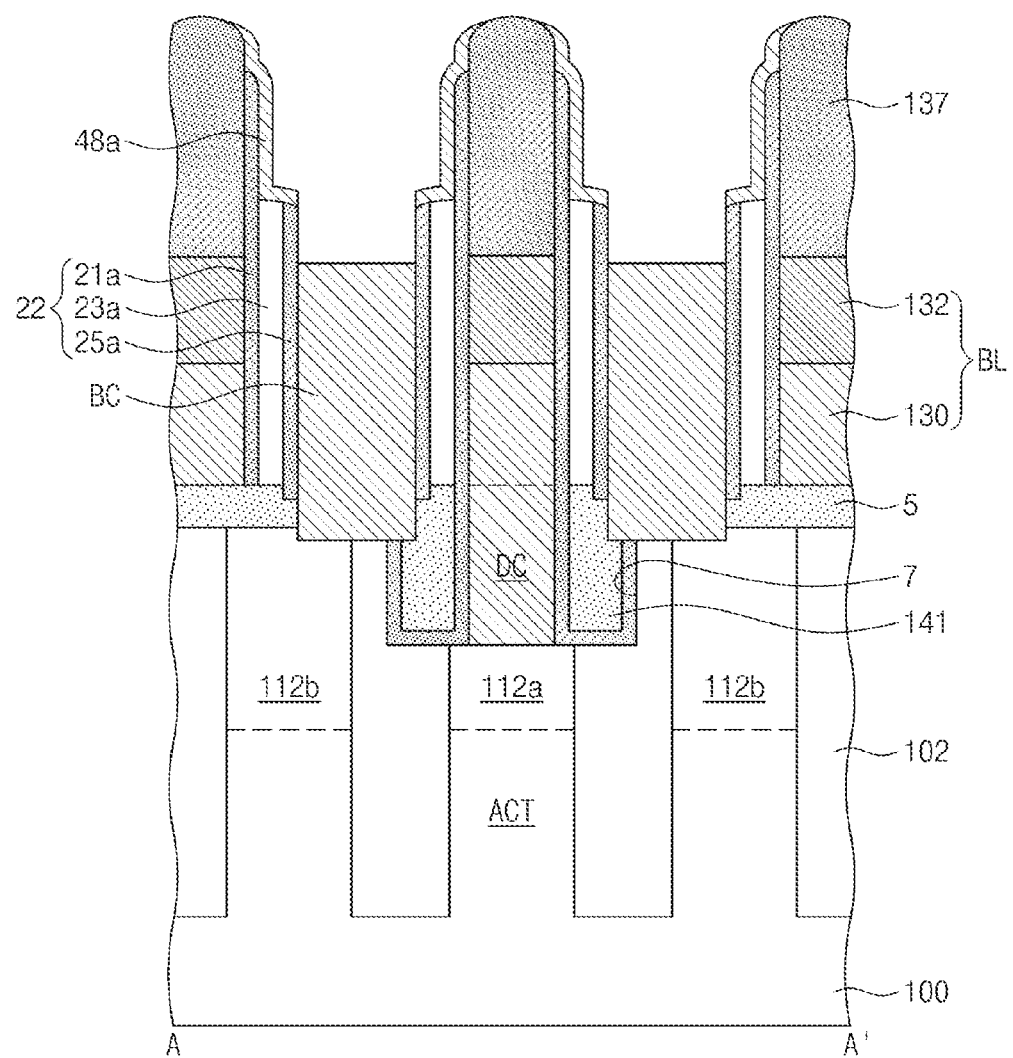

Referring to FIG. 8C, the second sacrificial spacer 50a may be used as an etch mask to recess the upper portion of the storage node contact plug BC. In this operation, the first sacrificial residue layer 48r may be removed. Sidewalls of the first and second sacrificial spacers 48a and 50a may be self-aligned with a sidewall of the third sub-spacer 25a, such that the third sub-spacer 25a may be relatively less etch-damaged. The second sacrificial spacer 50a may be removed after the upper portion of the storage node contact plug BC is recessed to a desired height. Alternatively, the second sacrificial spacer 50a may be removed at the same time when the storage node contact plug BC is recessed.

Figure 8D:
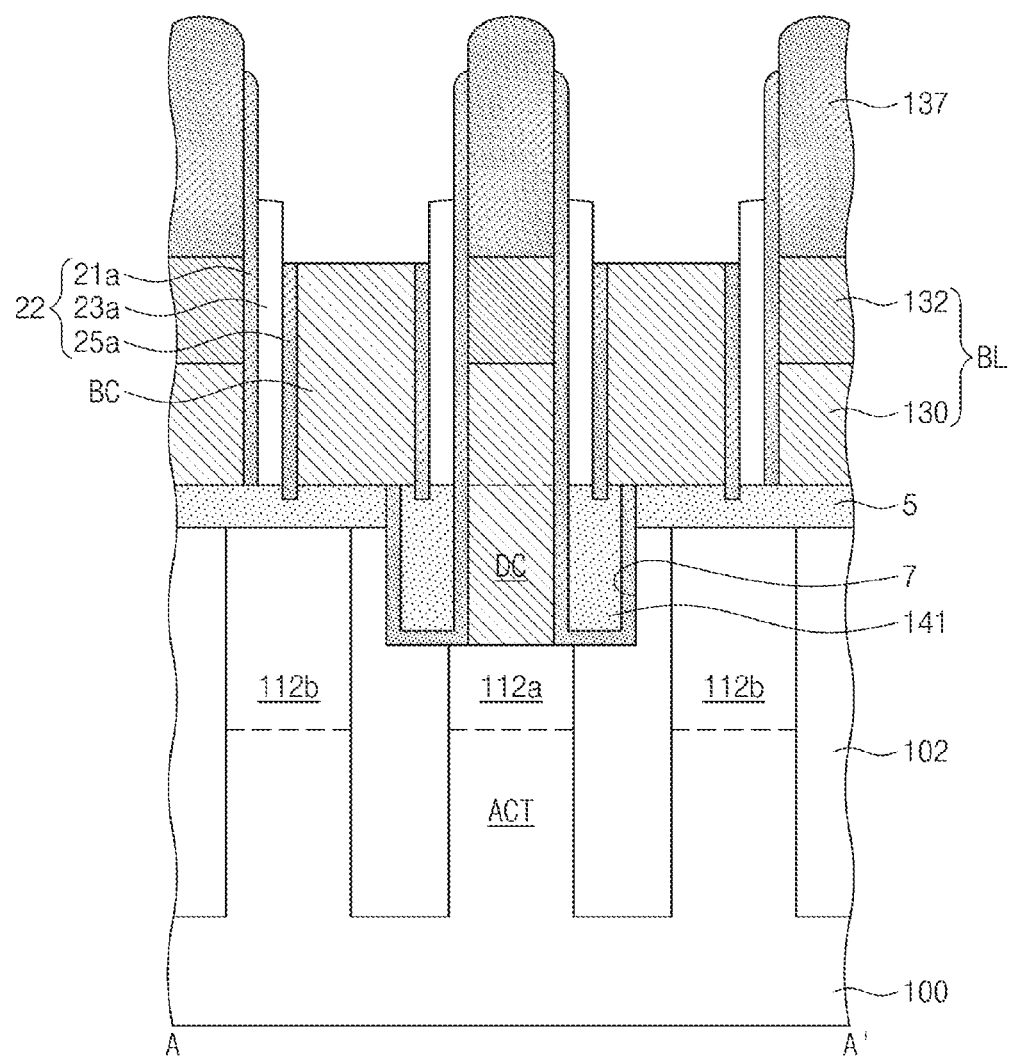

Referring to FIG. 8D, the first sacrificial spacer 48a may be removed to expose the upper sidewall of the first sub-spacer 21a. The third sub-spacer 25a may be processed to remove its upper portion whose sidewall is not covered with the storage node contact plug BC, and thus the second sub-spacer 23a may be exposed on its upper sidewall.

Figure 8E:
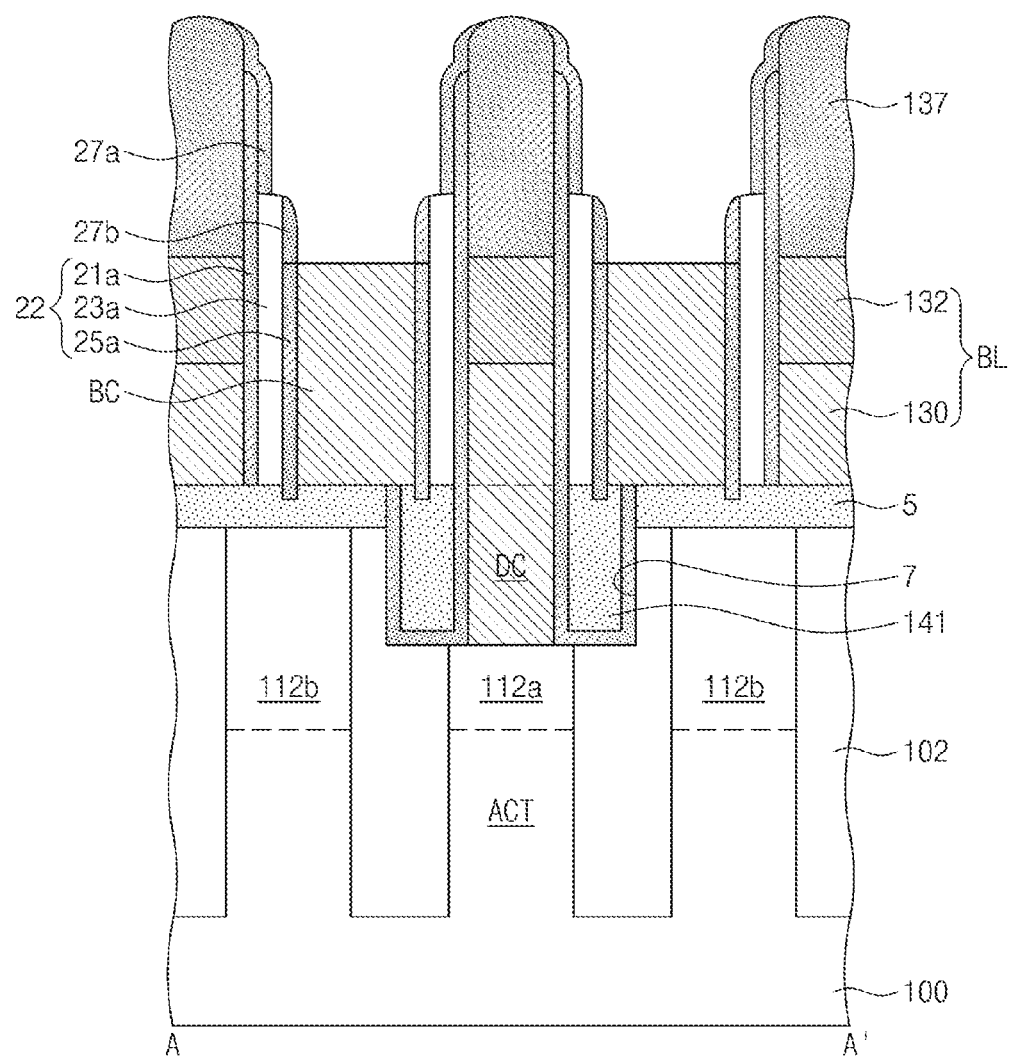

Referring to FIG. 8E, a second spacer layer may be conformally formed on the entire surface of the substrate 100 and then an anisotropic etching process may be performed to form a second spacer 27a covering the upper sidewall of the first sub-spacer 21a and to simultaneously form a third spacer 27b covering the exposed upper sidewall of the second sub-spacer 23a. Since the third spacer 27b is not etch-damaged in a process for etching the upper portion of the storage node contact plug BC or other processes, the third spacer 27b may have film quality superior to that of the removed portion of the third sub-spacer 25a. Accordingly, the storage node contact plug BC may experience a cleaning process on its top surface without forming a protective layer. For example, the third spacer 27b may sufficiently endure without being removed during the cleaning process. Since the cleaning process is performed without forming a protective layer, the storage node contact plug BC may be more fairly cleaned on its top surface. An ohmic layer (see 9 of FIG. 8F) may be eventually limited and/or prevented from being imperfectly formed caused by etch-byproducts possibly remaining on the top surface of the storage node contact plug BC.

Figure 8F:
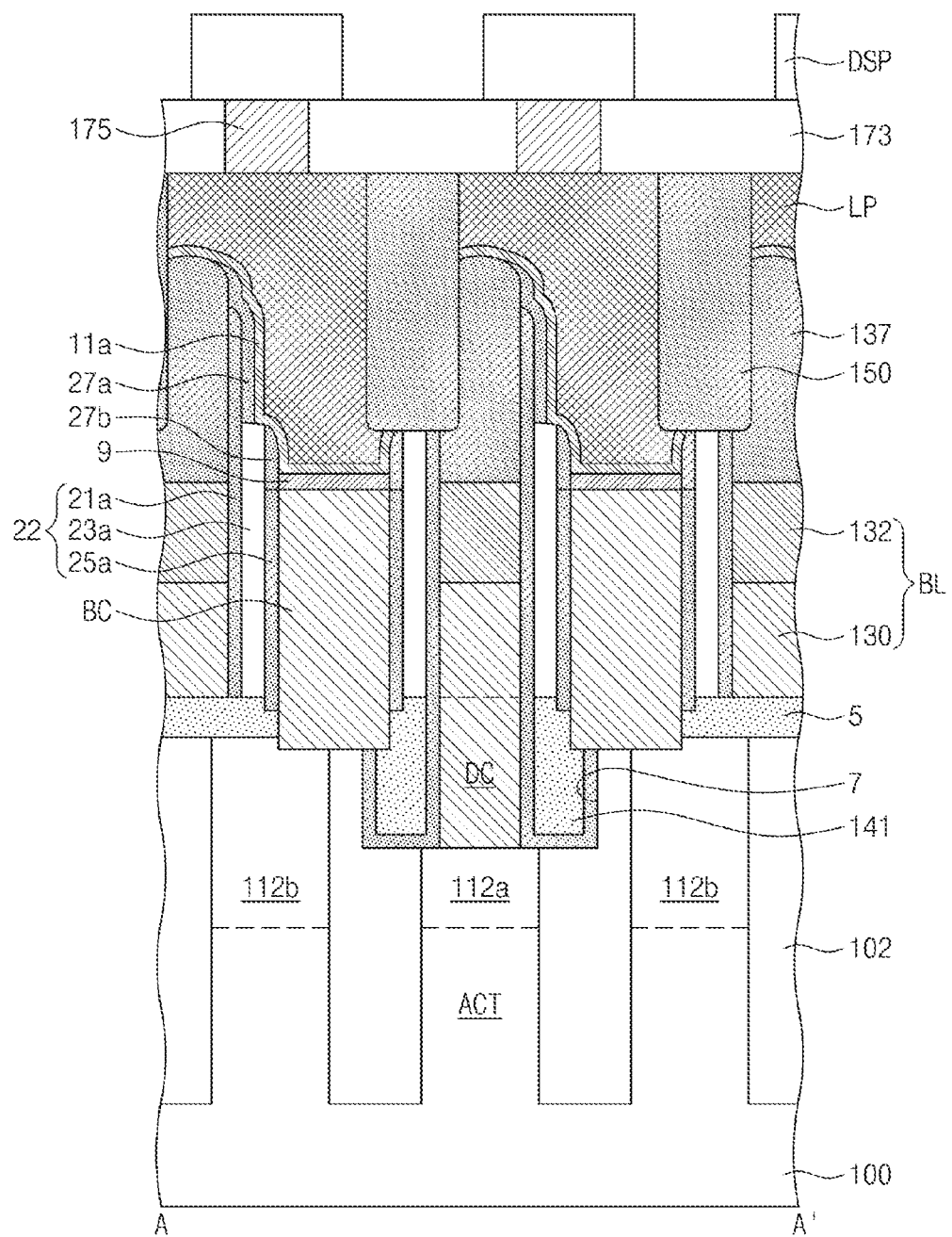

Referring to FIGS. 7A, 8F, and 7C, as discussed above, a cleaning process may be performed on the top surface of the storage node contact plug BC without forming a protective layer. Subsequent processes may be performed as discussed with reference to FIGS. 7A to 7C. FIG. 8F may correspond to a cross-sectional view taken along line A-A' of FIG. 7A according to example embodiments of inventive concepts. Referring to FIG. 8F, the third spacer 27b may cover the upper sidewall of the second sub-spacer 23a. The third spacer 27b may have a bottom surface in contact with the top surface of the second sub-spacer 25a. The third spacer 27b may have a width different from that of the third sub-spacer 25a.

FIGS. 9A to 9E are cross-sectional views sequentially illustrating a method of fabricating a semiconductor memory device according to example embodiments of inventive concepts.

Figure 9A:
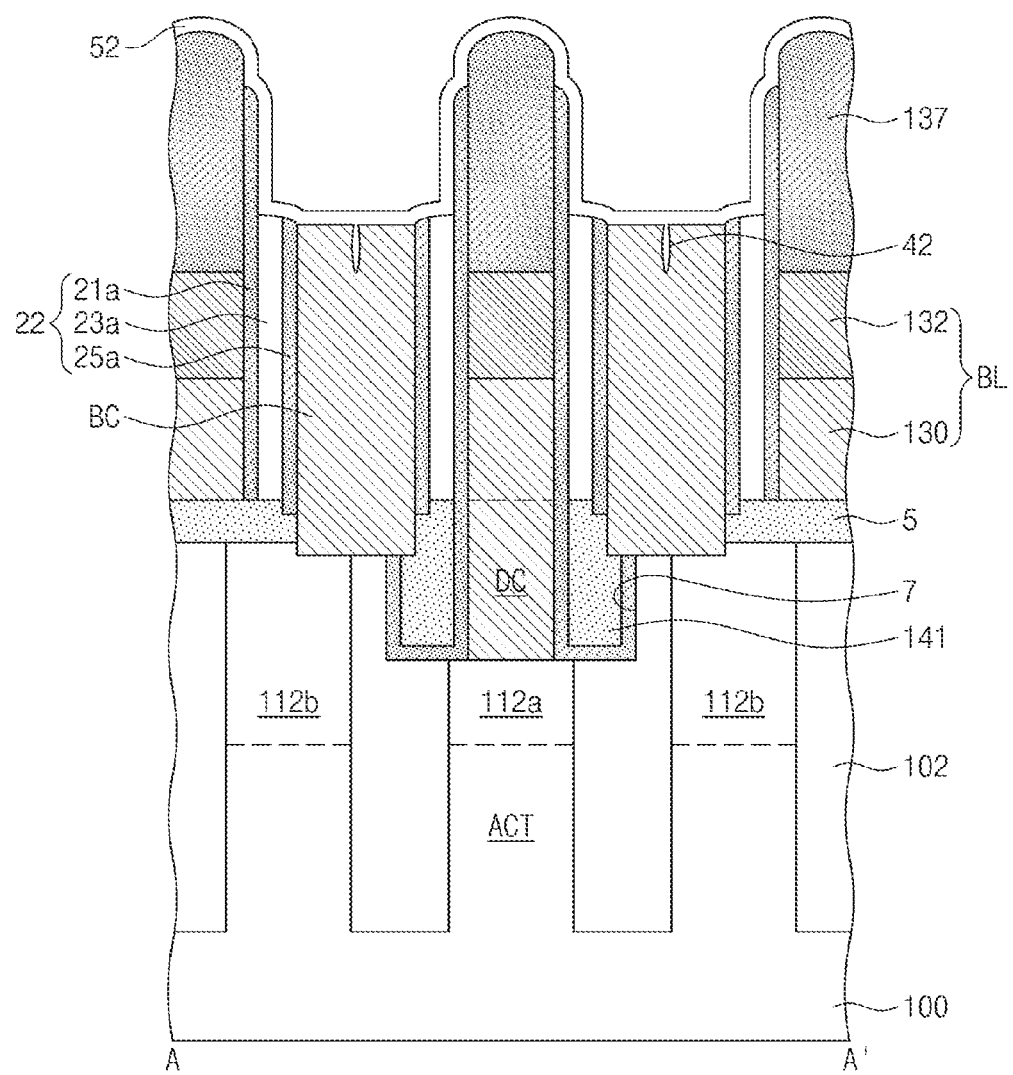
FIGS. 9A to 9E are cross-sectional views sequentially illustrating a method of fabricating a semiconductor memory device according to example embodiments of inventive concepts.

Referring to FIG. 9A, the void 42 may be filled with a first sacrificial layer 52 that is conformally formed on the entire surface of the substrate 100 shown in FIG. 6A. The first sacrificial layer 52 may be formed of, for example, a silicon oxide layer. A deposition process may be employed to form the first sacrificial layer 52.

Figure 9B:
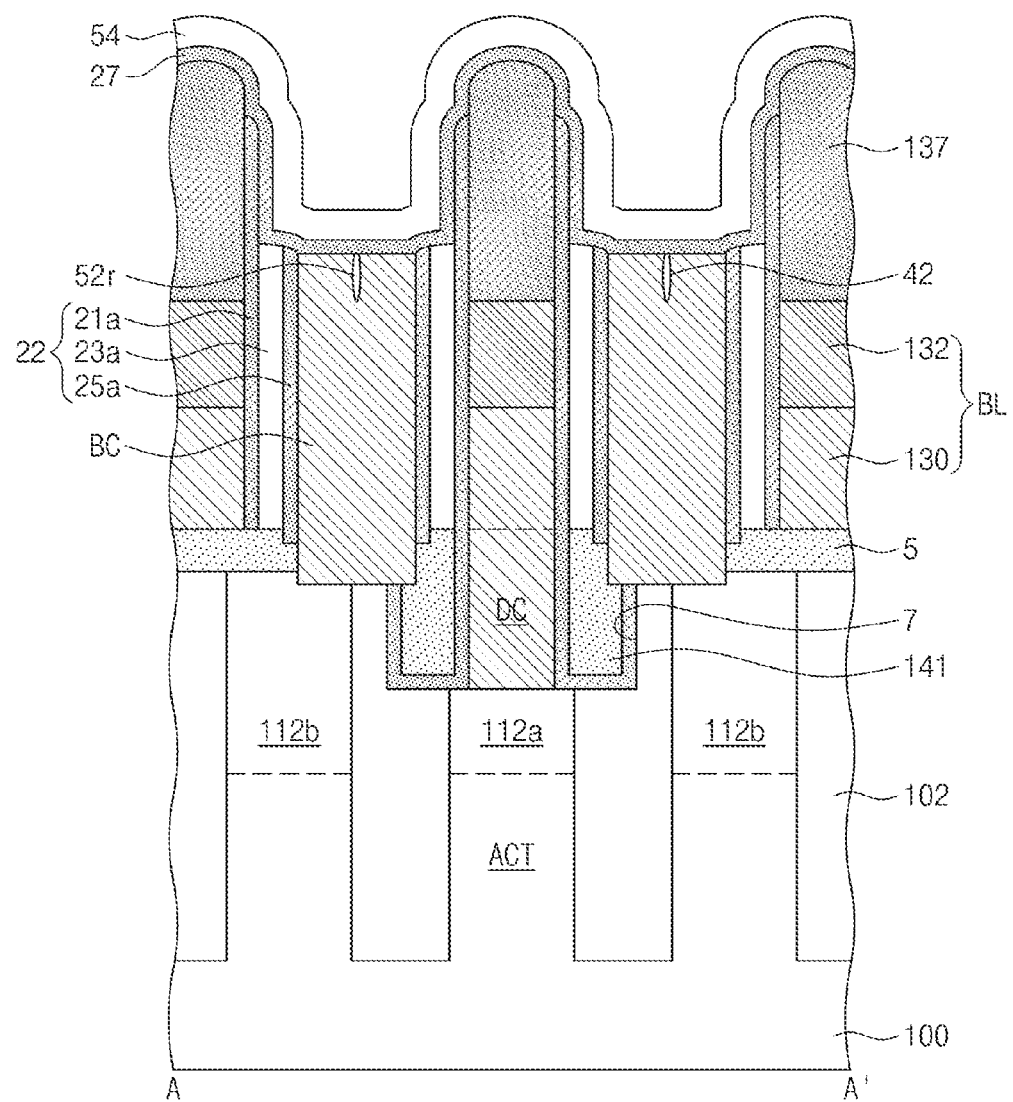

Referring to FIG. 9B, an etching process may be performed to remove the first sacrificial layer 52 and to expose the top surface of the storage node contact plug BC, while remaining a first sacrificial residue layer 52r in the void 42. A second spacer layer 27 may be conformally formed on the entire surface of the substrate 100. Since the void 42 is filled with the first sacrificial residue layer 52r, the second spacer layer 27 may not enter the void 42. A second sacrificial layer 54 may be conformally formed on the second spacer layer 27. The second sacrificial layer 54 may be formed of the same material as that of the first sacrificial layer 52. A sum of thicknesses of the second spacer layer 27 and the second sacrificial spacer layer 54 may be the same as or greater than a sum of widths of the second and third sub-spacers 23a and 25a.

Figure 9C:
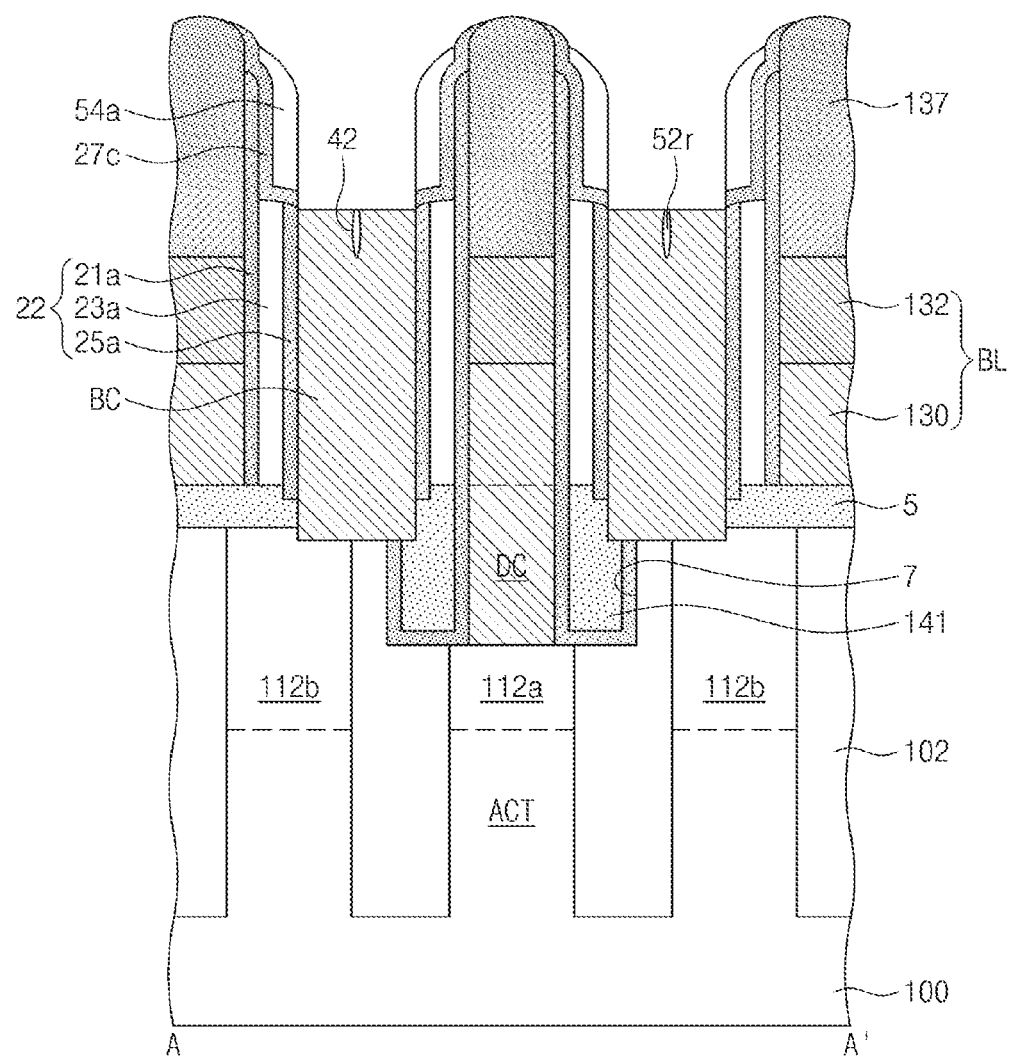

Referring to FIG. 9C, an anisotropic etching process may be performed on the second sacrificial layer 54 and the second spacer layer 27 to form a second spacer 27c and a second sacrificial spacer 54a that cover the upper sidewall of the first sub-spacer 21a and to expose the top surface of the storage node contact plug BC. The second sacrificial spacer 27c may be formed to cover top surfaces of the second and third sub-spacers 23a and 25a.

Figure 9D:
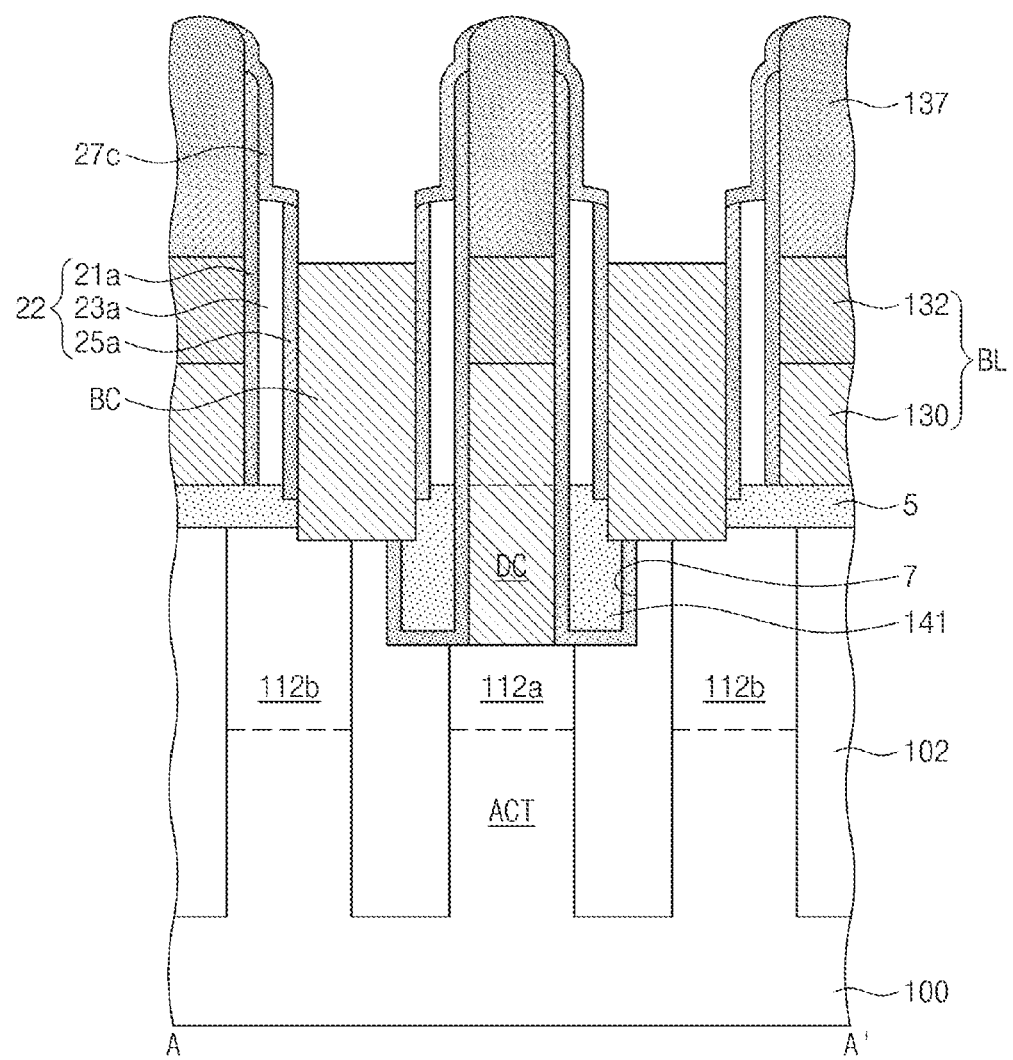

Referring to FIG. 9D, the second sacrificial spacer 54a and the first sacrificial residue layer 52r may be removed to expose a side surface of the second spacer 27c. The second sacrificial spacer 54a and the first sacrificial residue layer 52r may be simultaneously removed due to their same material. The second spacer 27c may be used as an etch mask to remove the upper portion of the storage node contact plug BC. In this operation, a structural feature of the second spacer 27c may reduce or prevent the third sub-spacer 25a from being etch-damaged. Accordingly, even without forming a protective layer, the third sub-spacer 25a may not be removed when a cleaning process is performed on the top surface of the storage node contact plug BC. The cleaning process may thus be positively performed without damaging the first spacer 22. As a result, an ohmic layer (see 9 of FIG. 9E) may be limited and/or prevented from being imperfectly formed caused by etch-byproducts possibly remaining on the top surface of the storage node contact plug BC.

Figure 9E:
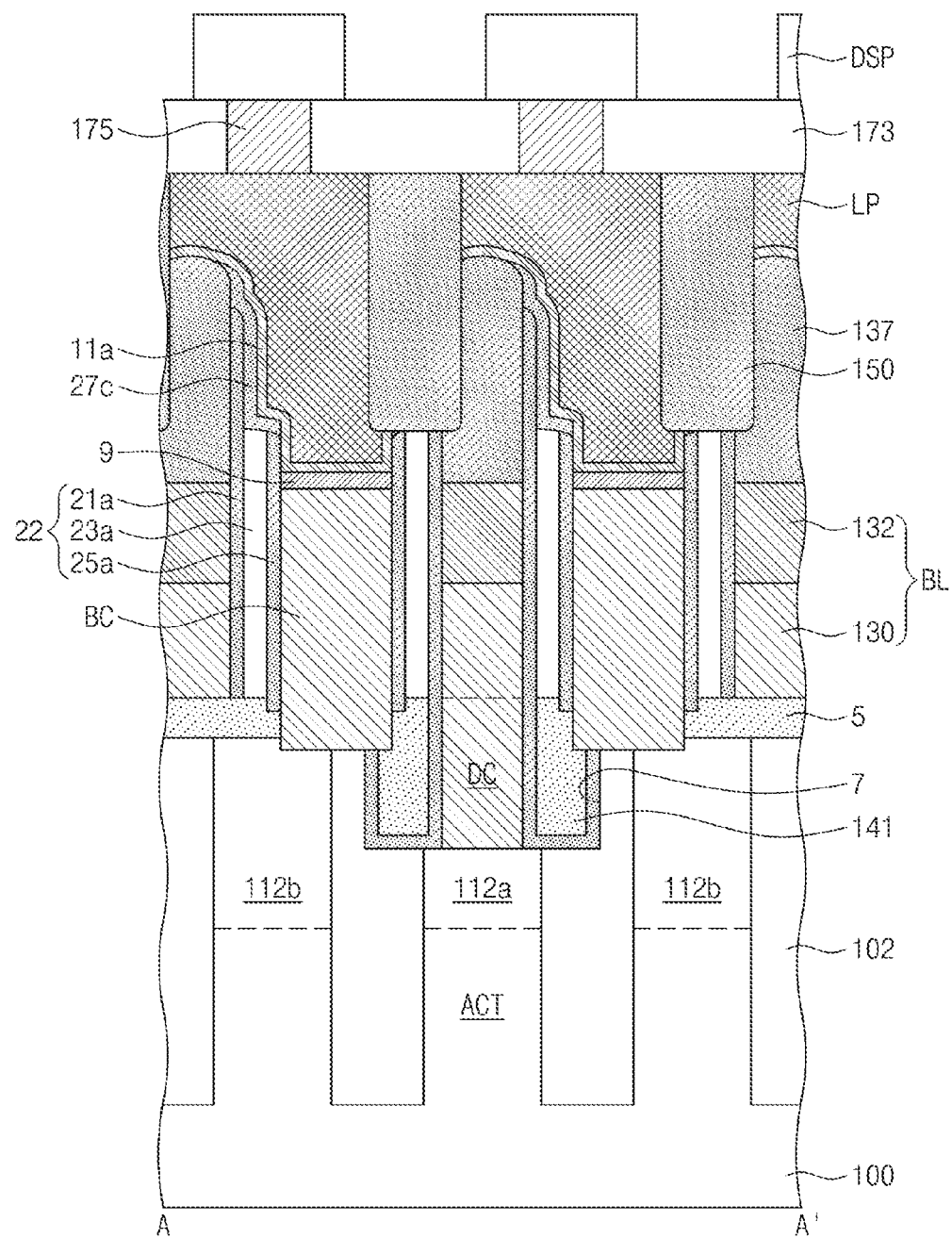

Referring to FIGS. 7A, 9E, and 7C, as discussed above, a cleaning process may be performed on the top surface of the storage node contact plug BC without forming a protective layer. Subsequent processes may be performed as discussed with reference to FIGS. 7A to 7C. FIG. 9E may correspond to a cross-sectional taken along line A-A' of FIG. 7A according to example embodiments of inventive concepts. Referring to FIG. 9E, the second spacer 27c may include a first segment adjacent to the bit line capping pattern 137 and a second segment covering top surfaces of the second and third sub-spacers 23a and 25a. The first and second segments may each have an L-shaped cross-section.

Figure 10A:
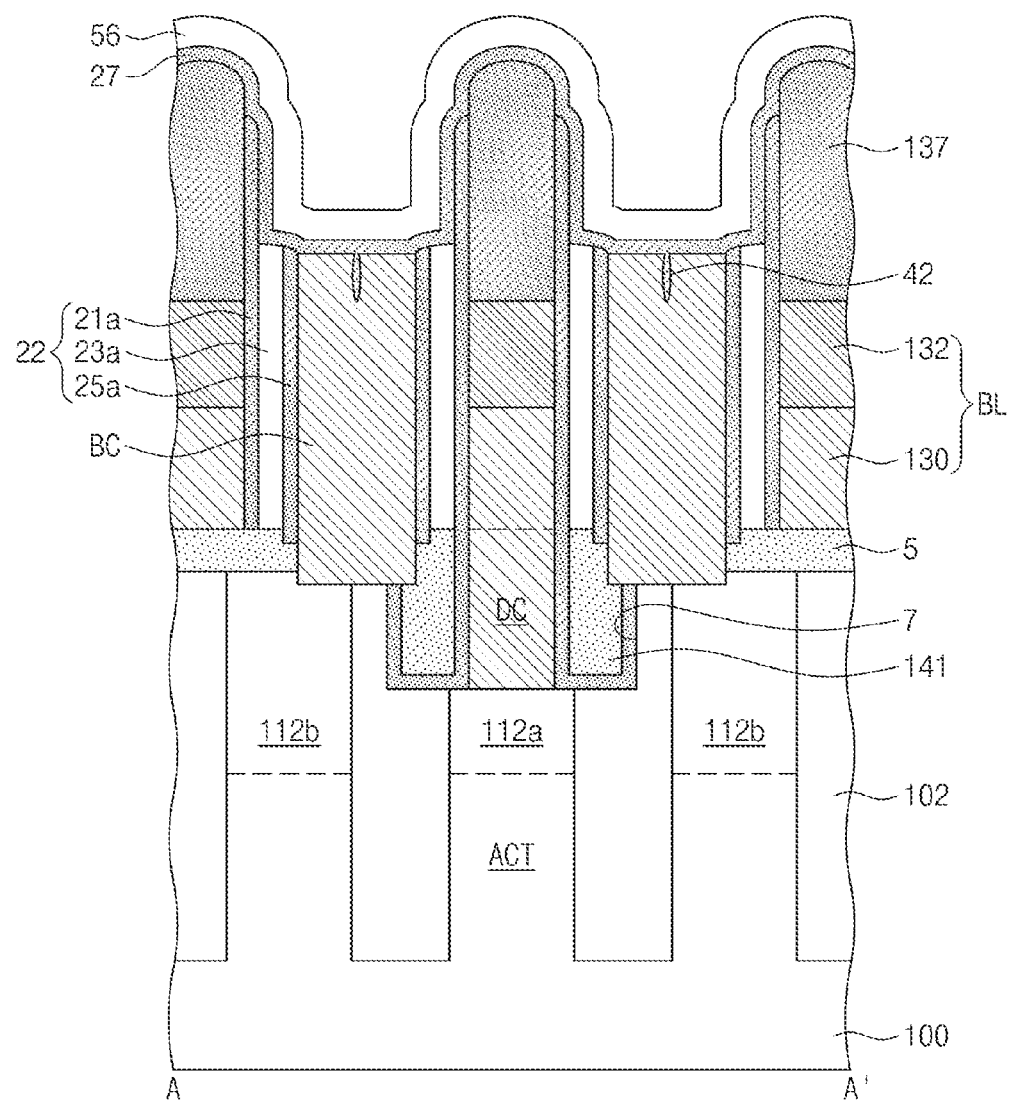
FIGS. 10A to 10C are cross-sectional views sequentially illustrating a method of fabricating a semiconductor memory device according to example embodiments of inventive concepts.
Figure 10B:
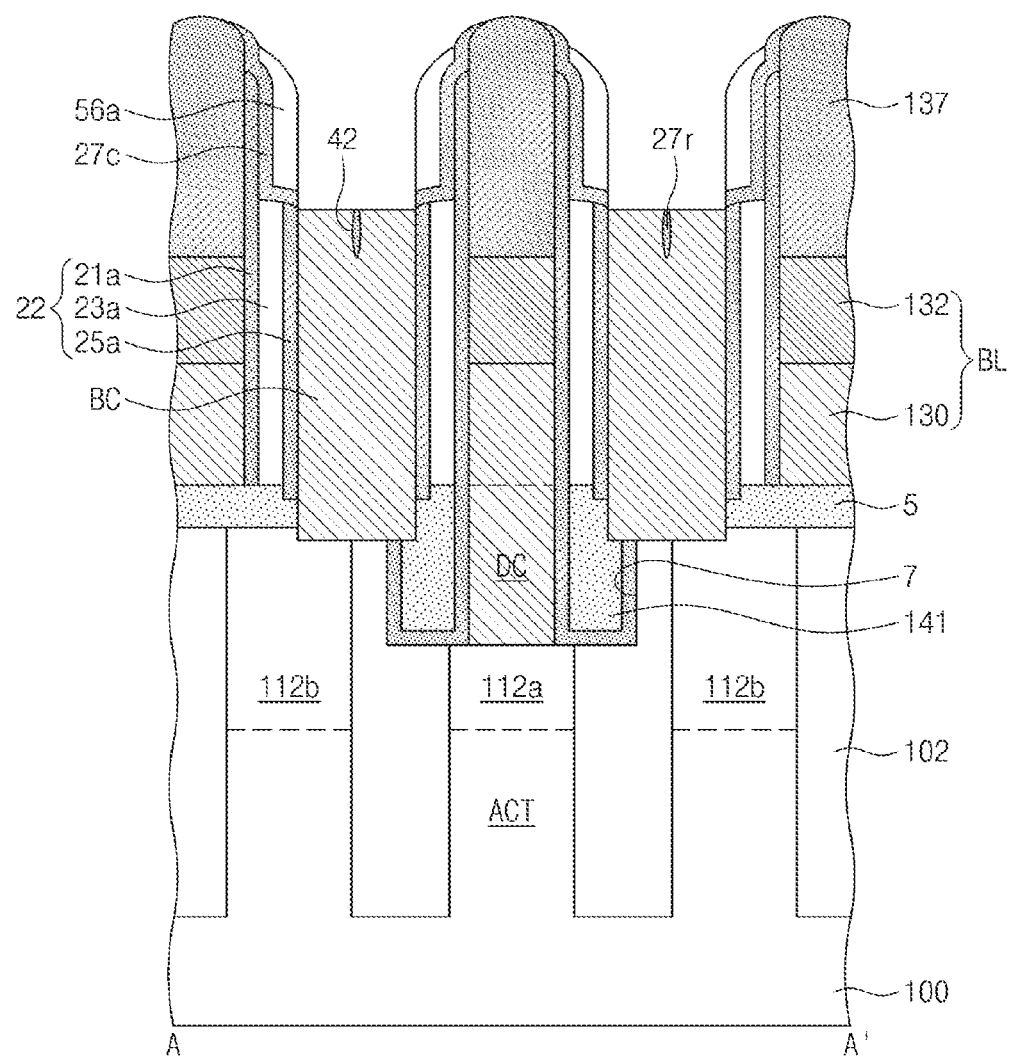
Figure 10C:
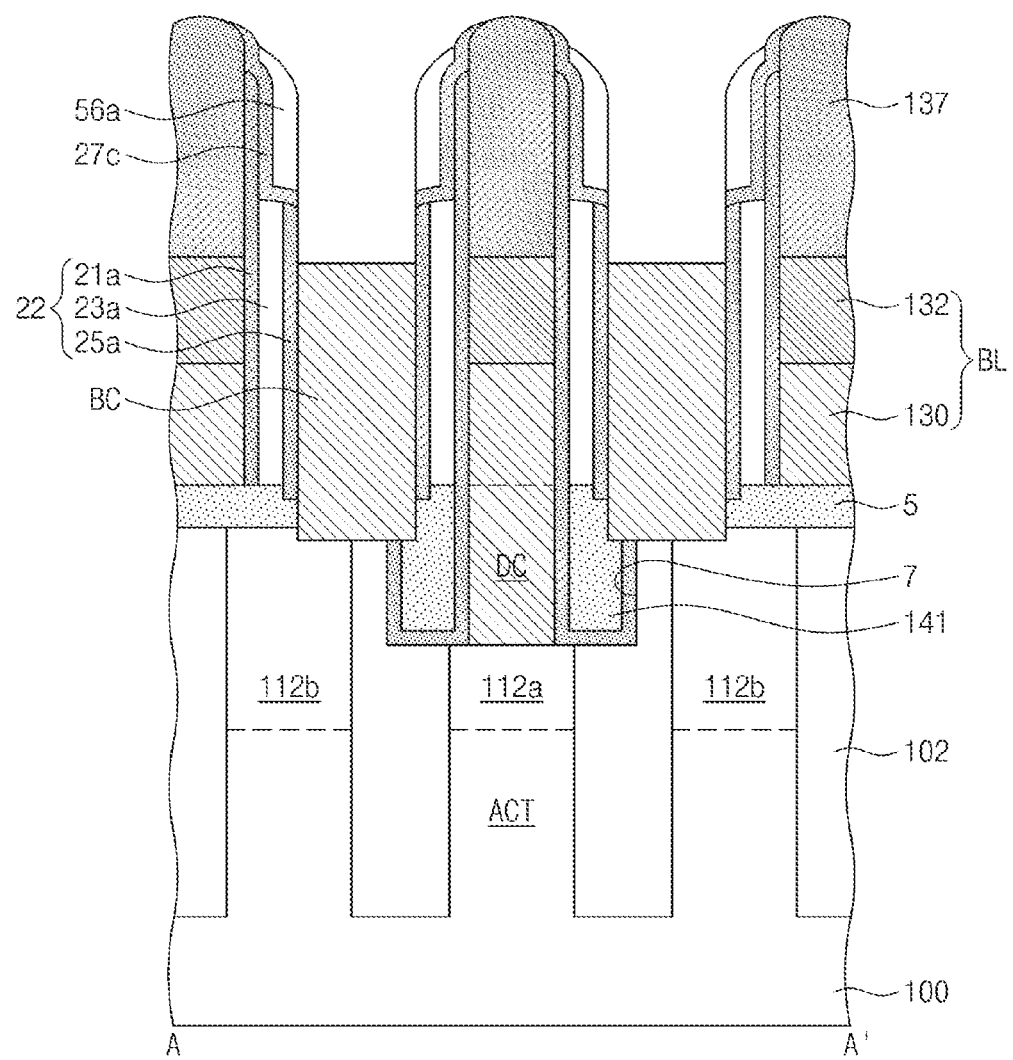

FIGS. 10A to 10C are cross-sectional views sequentially illustrating a method of fabricating a semiconductor memory device according to example embodiments of inventive concepts.

Referring to FIG. 10A, a second spacer layer 27 may be conformally formed on the entire surface of the substrate 100 shown in FIG. 6A. A deposition process may be employed to form the second spacer layer 27. The second spacer layer 27 may fill the void 42. A sacrificial layer 56 may be conformally formed on the second spacer layer 27. The sacrificial layer 56 may be formed of a material exhibiting an etch selectivity to the second spacer layer 27 and the storage node contact plug BC. The sacrificial layer 56 may be formed of, for example, a silicon oxide layer.

Referring to FIG. 10B, an anisotropic etching process may be performed on the sacrificial layer 56 and the second spacer layer 27 to form a second spacer 27c and a sacrificial spacer 56a that cover the upper sidewall of the first sub-spacer 21a. The second spacer 27c may be formed to cover top surfaces of the second and third sub-spacers 23a and 25a. The anisotropic etching process may expose the top surface of the storage node contact plug BC, and may leave a second spacer residue layer 27r in the void 42.

Referring to FIG. 10C, the second spacer residue layer 27r and the upper portion of the storage node contact plug BC may be removed by an etching process in which the sacrificial spacer 56a is used as an etch mask. The etching process may use an etching gas that can simultaneously etch the second spacer residue layer 27r and the storage node contact plug BC. The second spacer residue layer 27r may thus be removed. Subsequently, referring to FIG. 9D, the sacrificial spacer 56a may be removed. Other processes may be identical or similar to those discussed with reference to FIGS. 9D and 9E.

The above methods have been described to limit and/or prevent the ohmic layer from being imperfectly formed caused by a silicon nitride layer, used for forming the second spacer, remaining in the void or seam provided in the storage node contact plug BC. However, the ohmic layer may be imperfectly formed even though the storage node contact plug BC has no the void or seam therein. For example, when the cleaning process is insufficiently performed on the top surface of the storage node contact plug BC, the ohmic layer may be imperfectly formed.

Figure 11A:
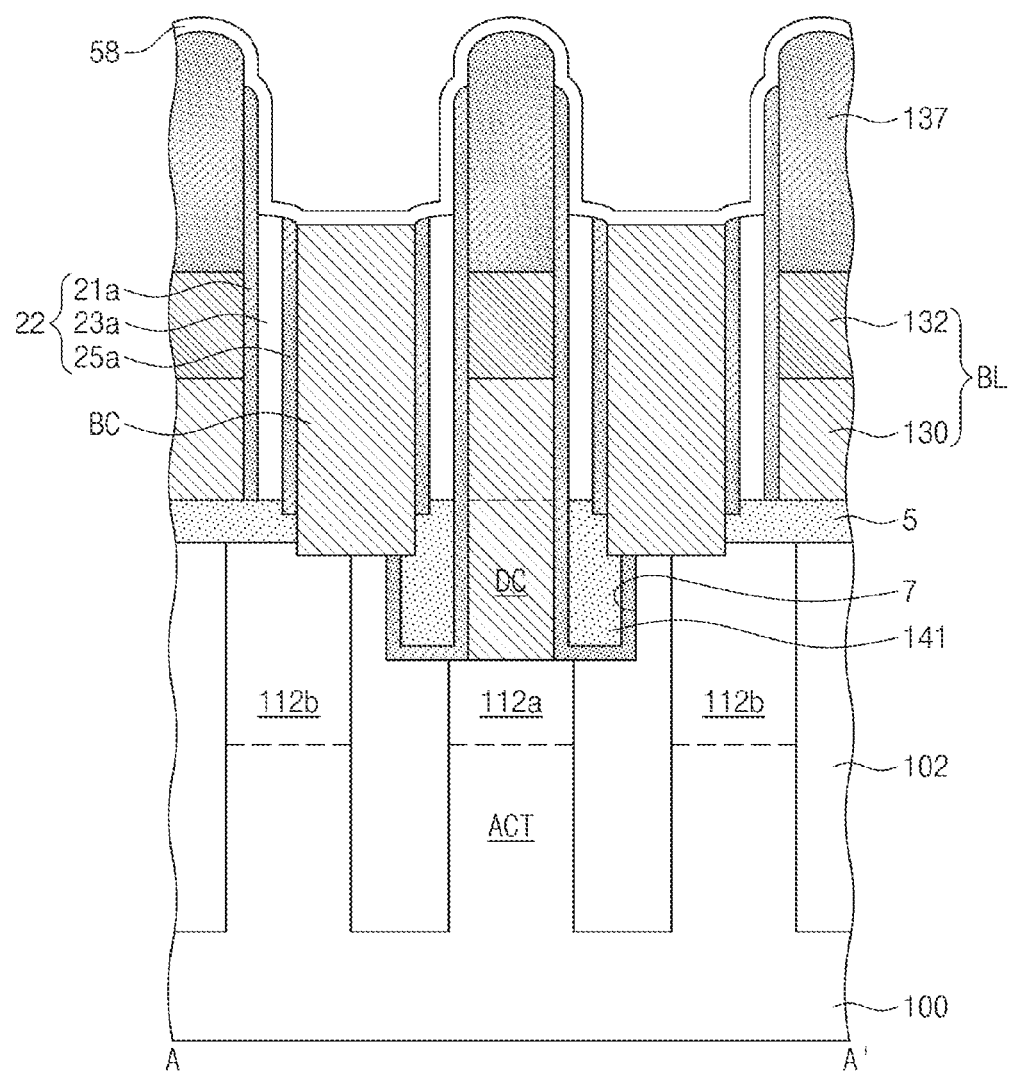
FIGS. 11A and 11B are cross-sectional views sequentially illustrating a method of fabricating a semiconductor memory device according to example embodiments of inventive concepts.
Figure 11B:
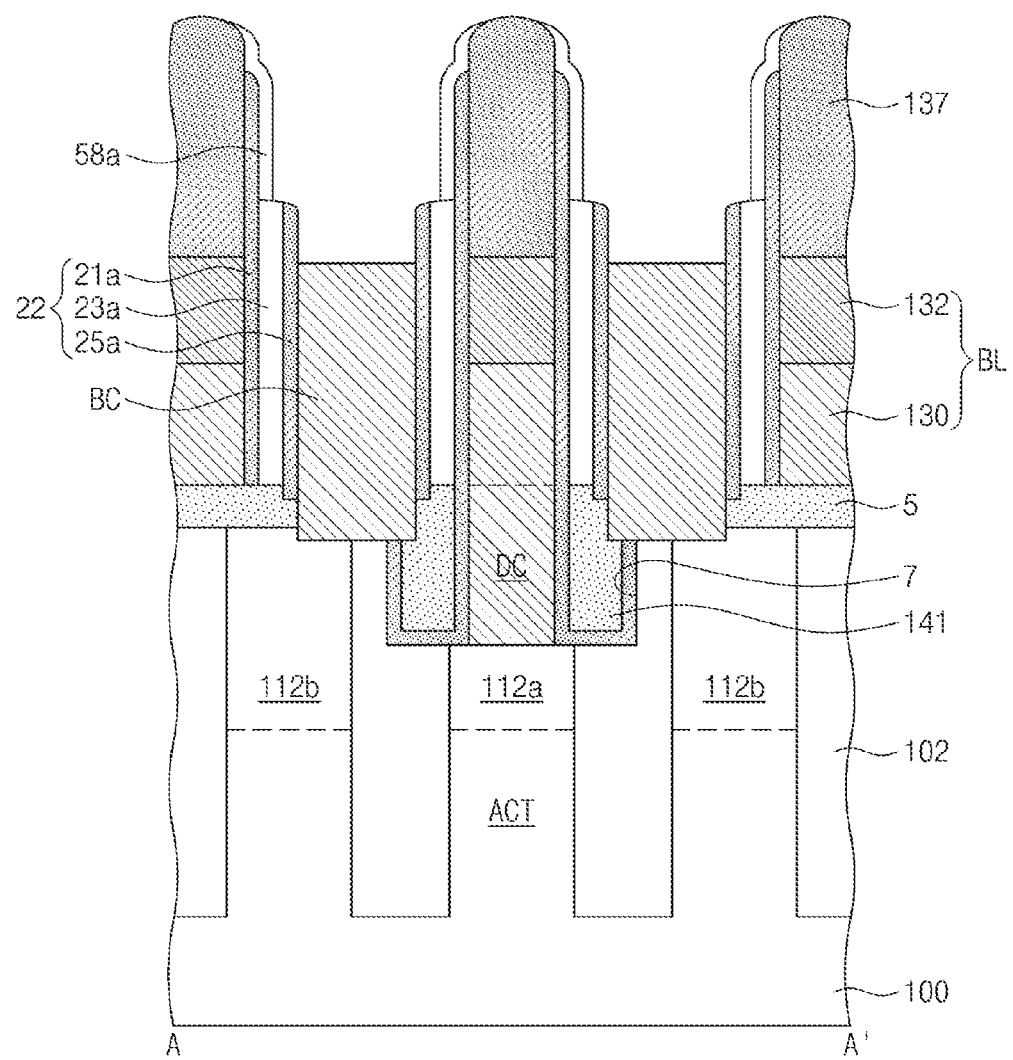

FIGS. 11A and 11B are cross-sectional views sequentially illustrating a method of fabricating a semiconductor memory device according to example embodiments of inventive concepts.

Referring to FIG. 11A, no void 42 may be formed on or in the storage node contact plug BC shown in FIG. 6A. After removing upper portions of the second and third sub-spacers 23a and 25a, a sacrificial layer 58 may be conformally formed on the entire surface of the substrate 100. The sacrificial layer 58 may be formed of a material exhibiting an etch selectivity to the first sub-spacer 21a. For example, the sacrificial layer 58 may be formed of a silicon oxide layer.

Referring to FIG. 11B, an anisotropic etching process may be performed on the sacrificial layer 58 to form a sacrificial spacer 58a covering the upper sidewall of the first sub-spacer 21a and to expose the top surface of the storage node contact plug BC. The sacrificial spacer 58a may be used as an etch mask to remove the upper portion of the storage node contact plug BC and to expose an upper sidewall of the third sub-spacer 25a. In this operation, the sacrificial spacer 58a may protect the first sub-spacer 21a.

Subsequently, referring to FIG. 8D, an etching process may be performed to remove the sacrificial spacer 58a. The third sub-spacer 25a may be processed to remove its exposed portion that is etch-damaged during the etching process. The partial removal of the third sub-spacer 25a may be carried out simultaneously with or separately from the removal of the sacrificial spacer 58a. Referring to FIG. 8E, second and third spacers 27a and 27b may be formed. The formation of the third spacer 27b may have an effect identical or similar to that discussed with reference to FIG. 8E.

Figure 12A:
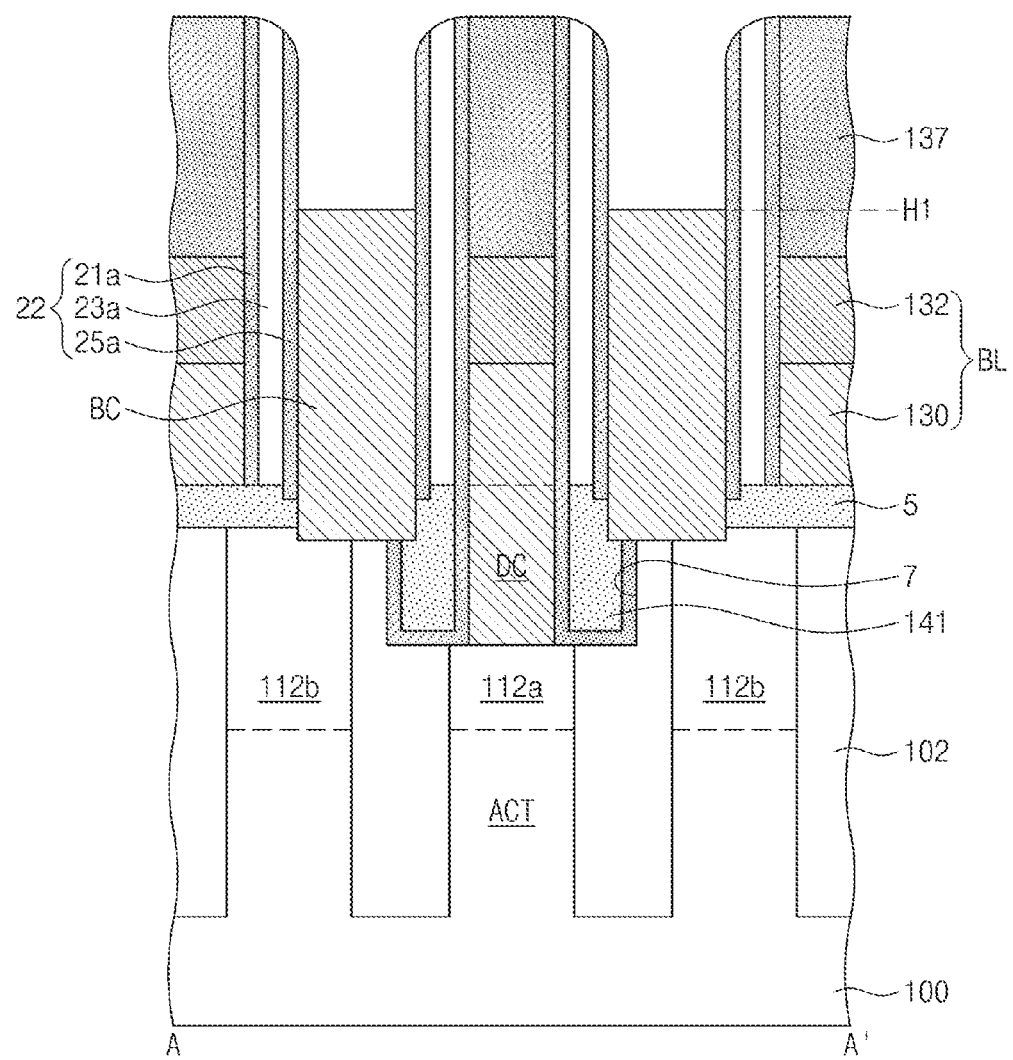
FIGS. 12A and 12B are cross-sectional views sequentially illustrating a method of fabricating a semiconductor memory device according to example embodiments of inventive concepts.
Figure 12B:
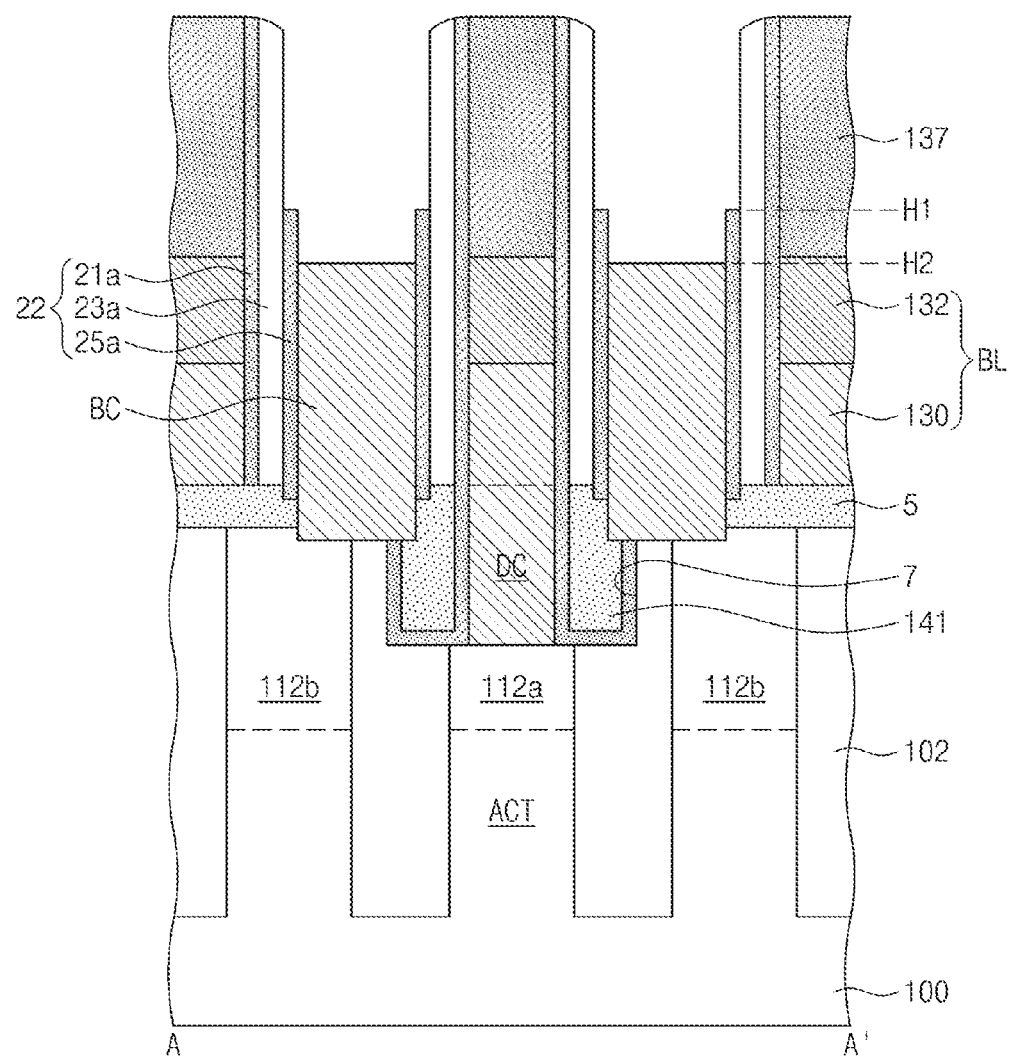

FIGS. 12A and 12B are cross-sectional views sequentially illustrating a method of fabricating a semiconductor memory device according to example embodiments of inventive concepts.

Referring to FIG. 12A, an impurity-doped polysilicon layer may be stacked on the substrate 100 shown in FIG. 5B and then etch-backed to form a storage node contact plug BC and to expose an upper sidewall of the third sub-spacer 25a. The storage node contact plug BC may have a top surface at a first height H1.

Referring to FIG. 12B, an exposed portion of the third sub-spacer 25a may be removed such that a top surface of the third sub-spacer 25a may descend to the first height H1. In addition, the second sub-spacer 23a may be exposed. The second sub-spacer 23a may be used as an etch mask to remove an upper portion of the storage node contact plug BC, so that the top surface of the storage node contact plug BC may eventually reach a desired second height H2. In this operation, the third sub-spacer 25a may be additionally exposed on its sidewall.

Subsequently, referring to FIG. 8D, an etching process may be performed such that the second sub-spacer 23a is processed to remove its exposed portion that is not covered with the third sub-spacer 25a. The third sub-spacer 25a may be processed to remove its exposed portion that is etch-damaged during the etching process. The exposed portion of the third sub-spacer 25a may be removed simultaneously with or separately from the exposed portion of the second sub-spacer 23a. Referring to FIG. 8E, second and third spacers 27a and 27b may be formed. The formation of the third spacer 27b may have an effect identical or similar to that discussed with reference to FIG. 8E.

Figure 13A:
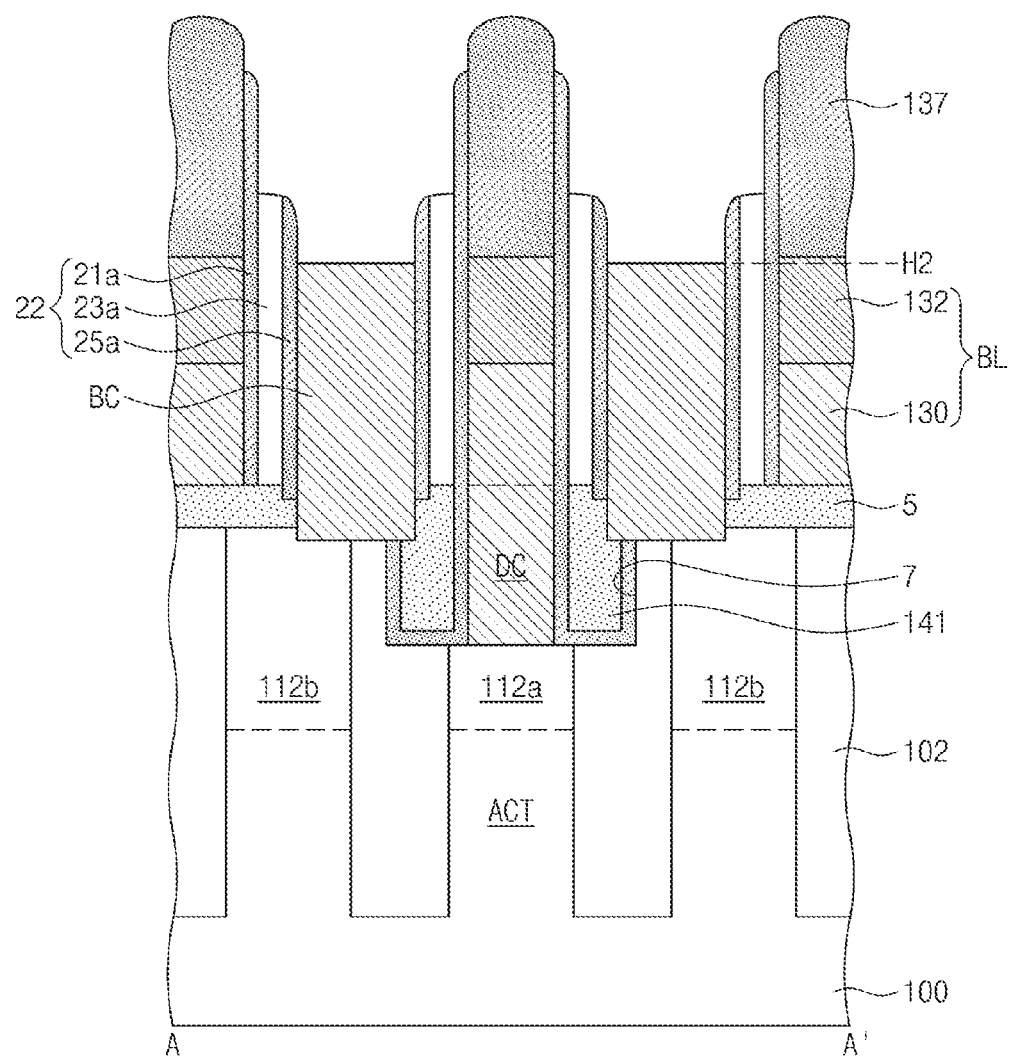
FIGS. 13A to 13C are cross-sectional views sequentially illustrating a method of fabricating a semiconductor memory device according to example embodiments of inventive concepts.
Figure 13B:
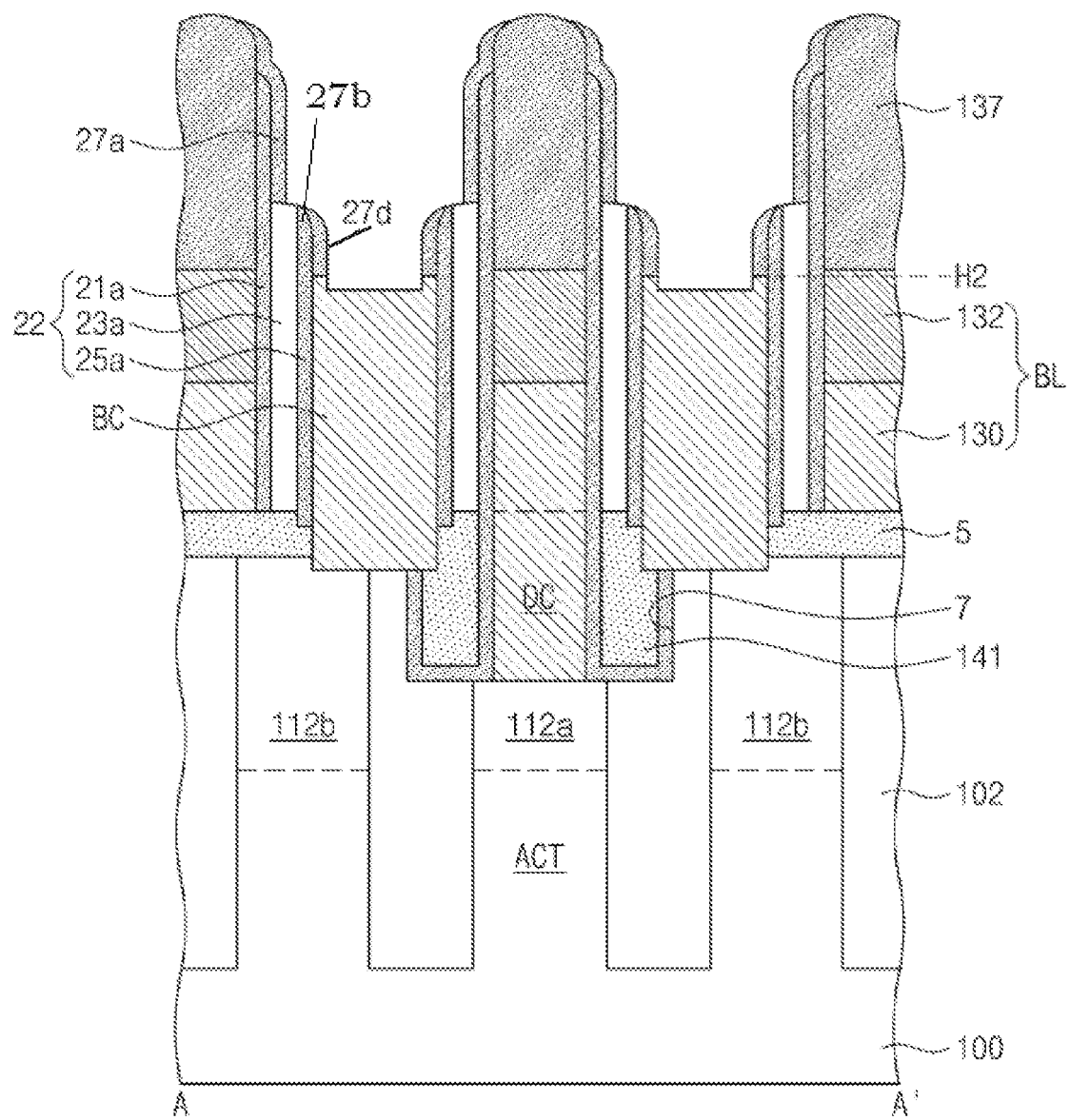
Figure 13C:
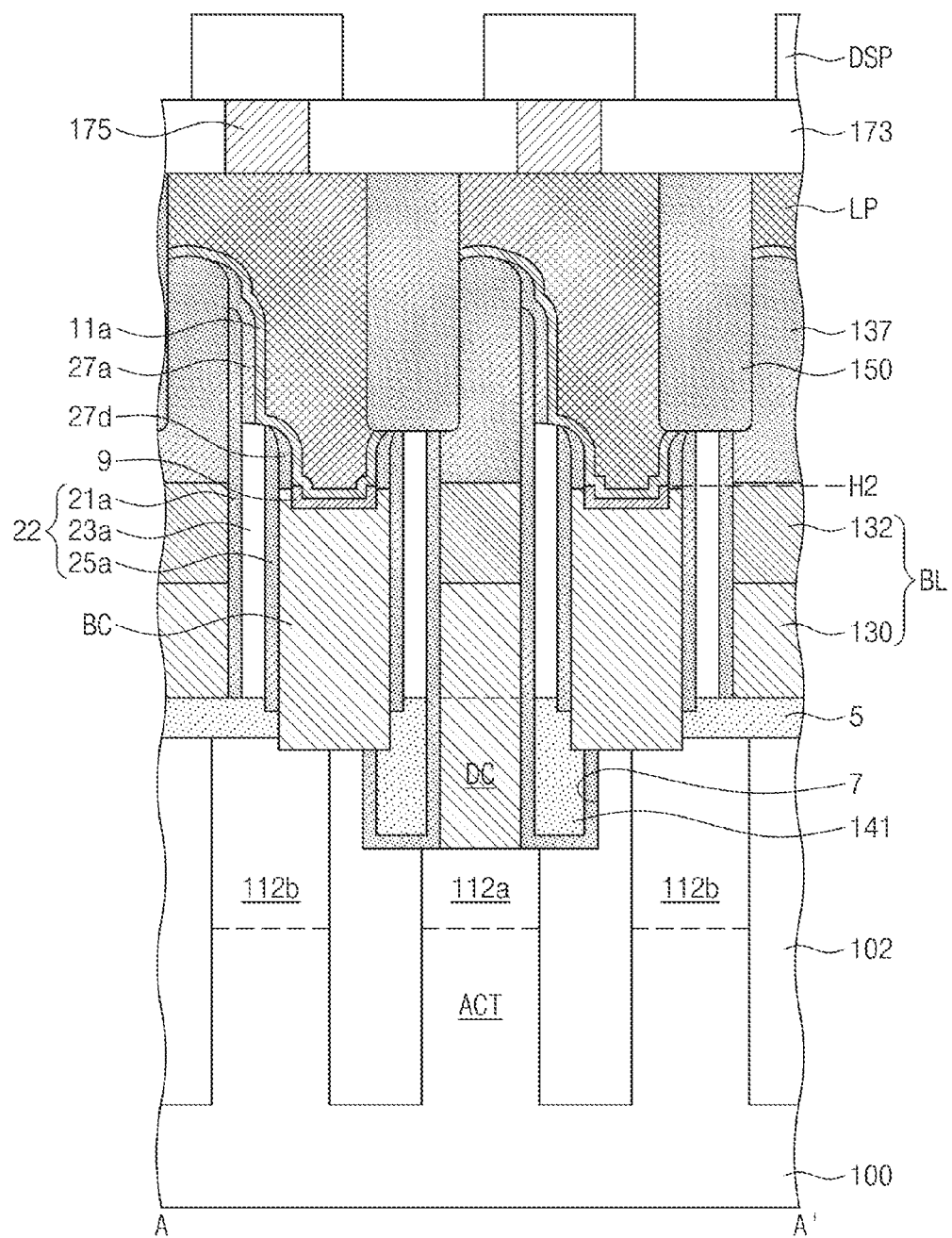

FIGS. 13A to 13C are cross-sectional views sequentially illustrating a method of fabricating a semiconductor memory device according to example embodiments of inventive concepts.

Referring to FIG. 13A, an etching process may be performed to remove upper portions of the second and third sub-spacers 23a and 25a shown in FIG. 12A. An additional etching process may be performed to remove the upper portion of the storage node contact plug BC, so that the top surface of the storage node contact plug BC may eventually reach a desired second height H2. In this operation, the third sub-spacer 25a may be exposed on its upper sidewall.

Referring to FIG. 13B, a second spacer layer may be conformally formed on the entire surface of the substrate 100 and then an anisotropic etching process may be performed to form a second spacer 27a covering a sidewall of the first sub-spacer 21a and to simultaneously form a third spacer 27b covering the exposed upper sidewall of the third sub-spacer 27d. The anisotropic etching process may partially recess the top surface of the storage node contact plug BC. And then, without forming a protective layer, a cleaning process may be performed on the storage node contact plug BC. The third sub-spacer 25a may suffer from etch-damage resulting from the previous etching processes. Since the etch-damaged third sub-spacer 25a is covered with the third spacer 27d, the etch-damaged third sub-spacer 25a may be limited and/or prevented from being removed in the cleaning process.

Referring to FIG. 13C, an ohmic layer 9 may be formed by subsequent processes identical or similar to those discussed with reference to FIGS. 7A to 7C. Since the cleaning process is performed without forming a protective layer, the storage node contact plug BC may be sufficiently cleaned on its top surface. The ohmic layer 9 may therefore be limited and/or prevented from being imperfectly formed. Thereafter, a diffusion prevention pattern 11a and a landing pad LP may be formed. FIG. 13C may correspond to a cross-sectional taken along line A-A' of FIG. 7A according to example embodiments of inventive concepts. A semiconductor memory device of FIG. 13C may further include the third spacer 27d covering the upper sidewall of the third sub-spacer 25a. The top surface of the storage node contact plug BC may include a concave portion. The ohmic layer 9 may also have a concave structure.

Figure 14:
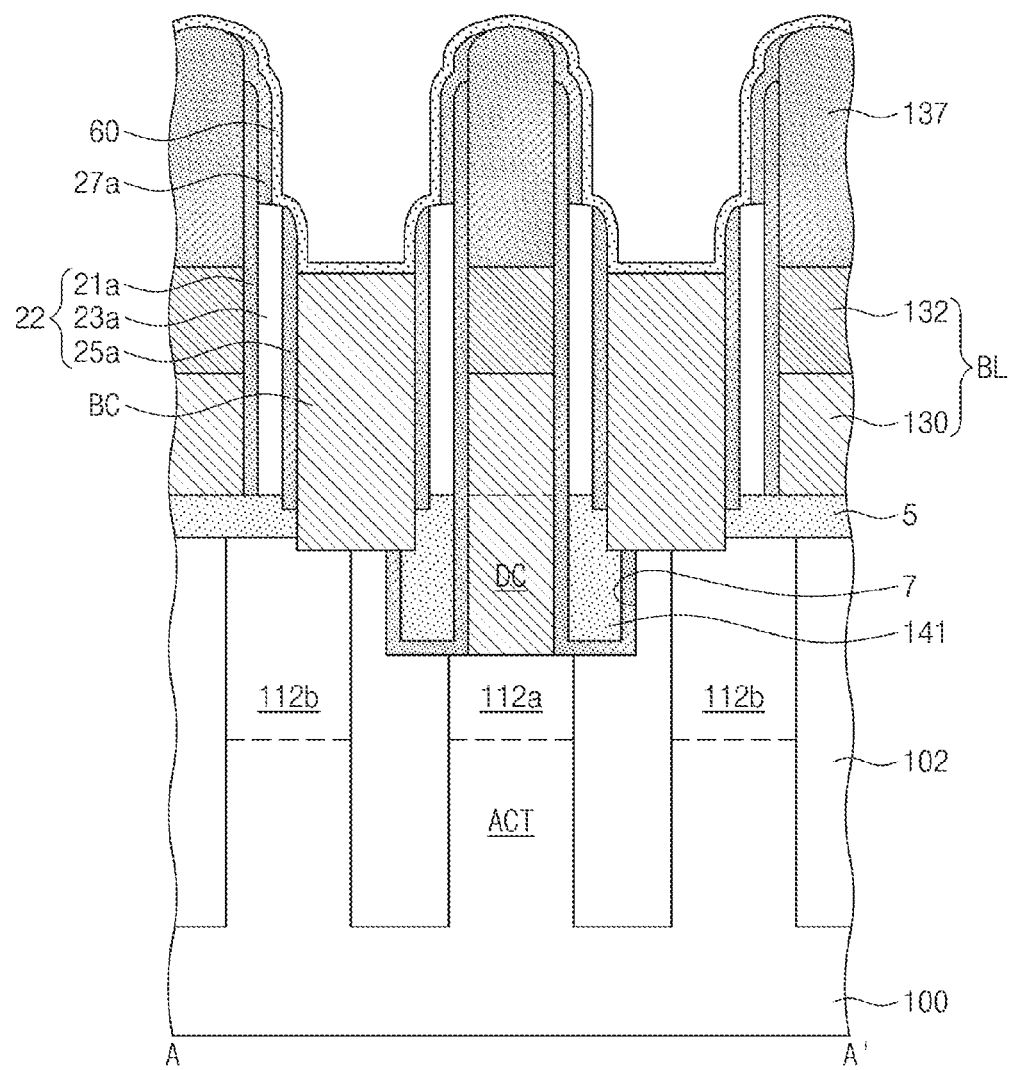
FIG. 14 is a cross-sectional view sequentially illustrating a method of fabricating a semiconductor memory device according to example embodiments of inventive concepts.

FIG. 14 is a cross-sectional view sequentially illustrating a method of fabricating a semiconductor memory device according to example embodiments of inventive concepts.

Referring to FIG. 14, a protective layer 60 may be conformally formed on the entire surface of the substrate 100 shown in FIG. 13A. A material of the protective layer 60 may be etched faster (or removed at a high etch rate) than that of the second spacer 27a. For example, the second spacer 27a may be formed of a silicon nitride layer, and the protective layer 60 may be formed of a silicon oxide layer or a silicon-boron nitride (SiBN) layer. A cleaning process may be performed to clean the top surface of the storage node contact plug BC in a state that the protective layer 60 is formed. Since the protective layer 60 is removed more easily than a silicon nitride layer when the cleaning process is performed, in comparison with a case where a silicon nitride layer covers the entire surface of the substrate 100, contaminants may be readily removed from the top surface of the storage node contact plug BC. In addition, the protective layer 60 may protect an etch-damaged upper portion of the third sub-spacer 25a when the cleaning process is performed. The cleaning process may completely remove the protective layer 60. Subsequent processes may be identically or similarly performed to those as discussed with reference to FIGS. 7A to 7C.

FIGS. 15A to 15E are cross-sectional views sequentially illustrating a method of fabricating a semiconductor memory device according to example embodiments of inventive concepts.

Figure 15A:
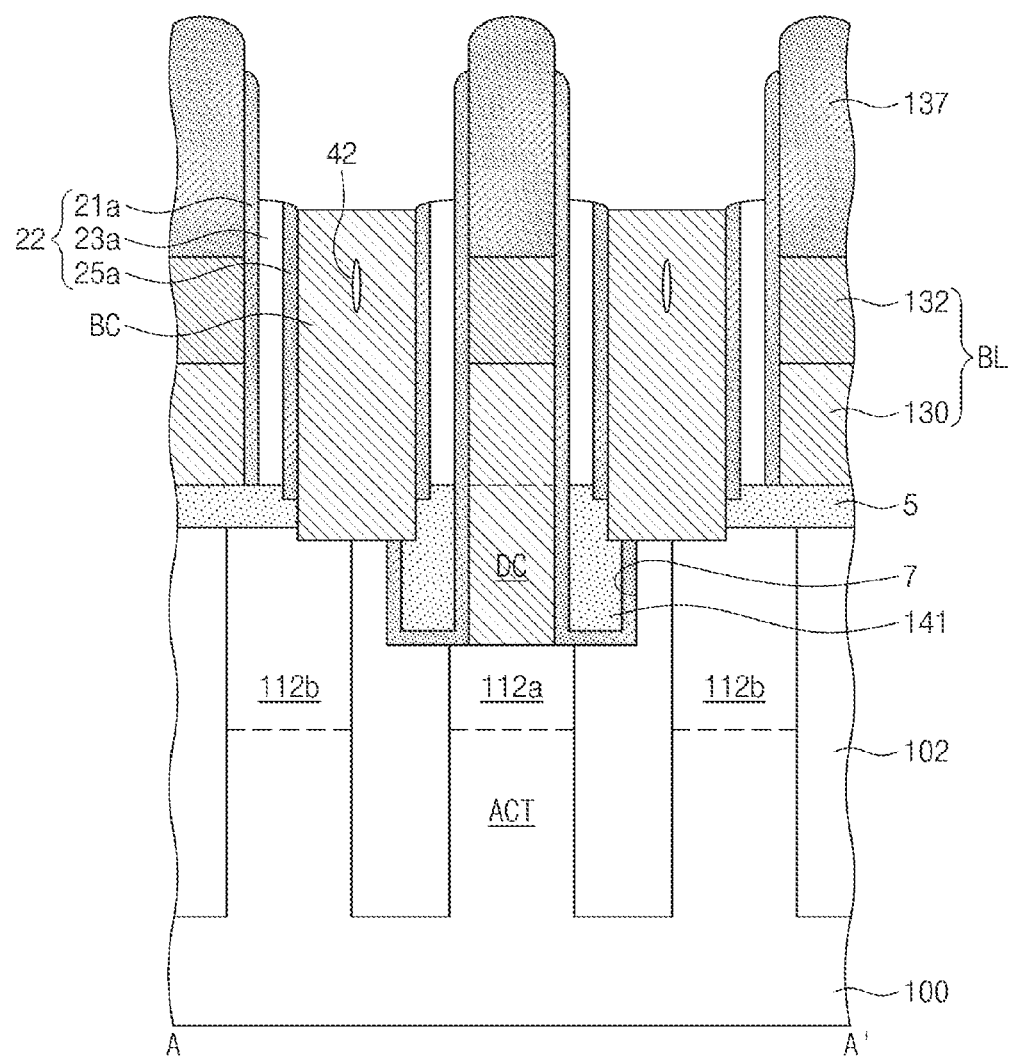
FIGS. 15A to 15E are cross-sectional views sequentially illustrating a method of fabricating a semiconductor memory device according to example embodiments of inventive concepts.

Referring to FIG. 15A, an impurity-doped polysilicon layer may be stacked on the entire surface of the substrate 100 on which the storage node isolation pattern 40 is formed shown in FIG. 5B, and may then be etched to form between neighboring first spacers 22 a storage node contact plug BC whose top surface is lower than that of the bit line capping pattern 137. The storage node contact plug BC may be formed to include a seam or void 42. When the polysilicon layer is stacked, a narrow spacing between the first spacers 22 may accelerate occurrence of the seam or void 42. An etching process may be performed such that the second and third sub-spacers 23a and 25a are removed at their portions whose side surfaces are not covered with the storage node contact plug BC, thereby exposing an upper sidewall of the first sub-spacer 21a.

Figure 15B:
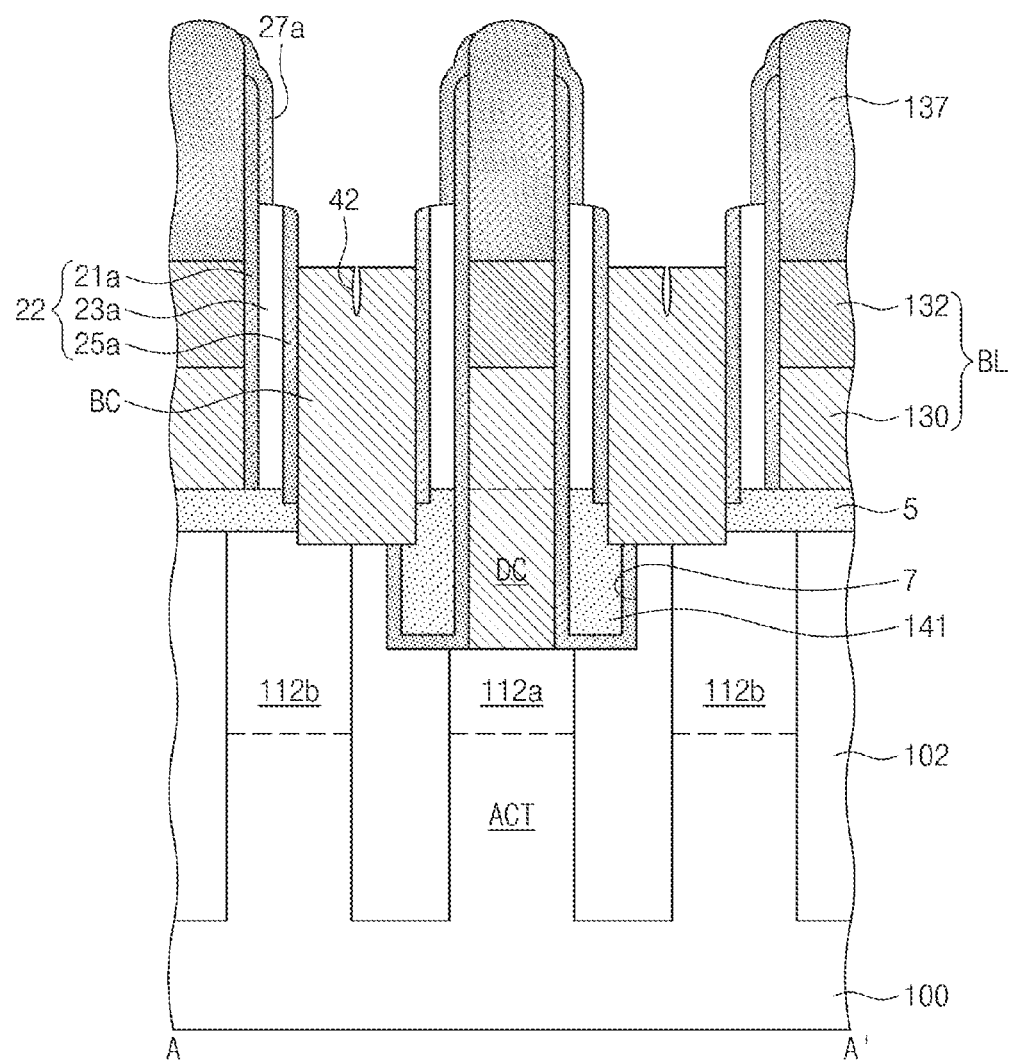

Referring to FIG. 15B, a second spacer layer may be conformally formed on the entire surface of the substrate 100. The second spacer layer may be formed of, for example, a silicon nitride layer. An anisotropic etching process may be performed on the second spacer layer to expose a top surface of the storage node contact plug BC and at the same time to form a second spacer 27a covering the exposed upper sidewall of the first sub-spacer 21a. The second spacer 27a may be formed to have a width less than a sum of widths of the second and third sub-spacers 23a and 25a. Accordingly, between the bit line capping patterns 137, the second spacers 27a may be spaced at a distance greater than that between the first spacers 22. An increased connecting area may thus be made between the storage node contact plug BC and a landing pad LP which is formed in a subsequent process. In addition, between the bit line capping patterns 137, the spacing between the second spacers 27a may be adjusted independently of the spacing between the first spacers 22. The second spacer 27a may have a bottom surface in contact with a top surface of the second sub-spacer 23a. The top surface of the second sub-spacer 23a may be partially exposed without being covered with the second spacer 27a. The second spacer 27a and the bit line capping pattern 137 may be used as an etch mask to remove an upper portion of the storage node contact plug BC and to expose an upper portion of the third sub-spacer 25a. In this operation, the void 42 may also be exposed. A sidewall of the third sub-spacer 25a may be etch-damaged in an etching process for removing the upper portion of the storage node contact plug BC.

Figure 15C:
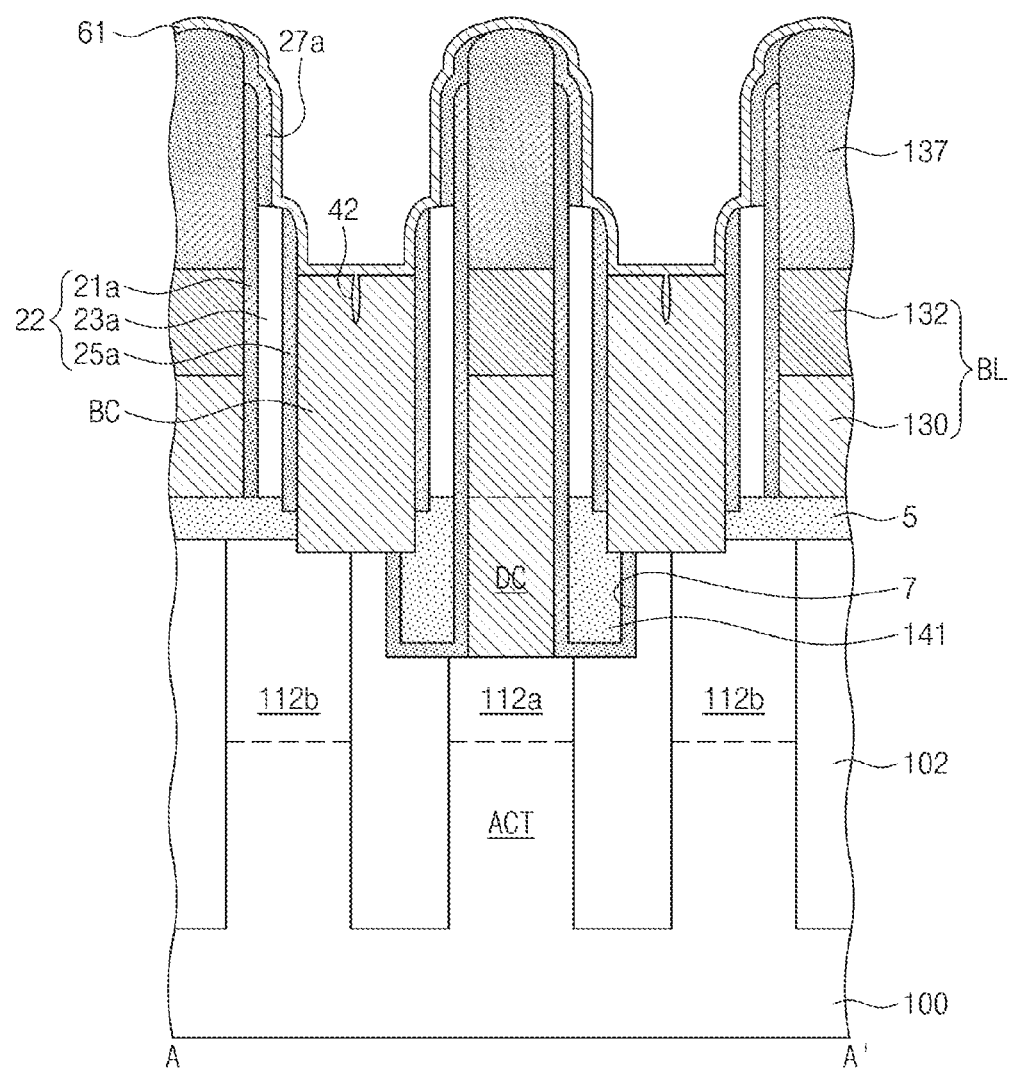

Referring to FIG. 15C, a protective layer 61 may be conformally formed on the entire surface of the substrate 100. The protective layer 61 may be formed of the same material as that of the storage node contact plug BC. For example, the protective layer 61 may be formed of an impurity-doped or undoped polysilicon layer. A deposition process may be employed to form the protective layer 61. An impurity may be in-situ doped into the protective layer 61 during its deposition, or may be doped by an ion implantation process additionally performed on the protective layer 61 after its deposition. An impurity-doping concentration of the protective layer 61 may be adjusted to control a removal rate of the protective layer 61 in a subsequent cleaning process. For example, as the impurity-doping concentration increases, the protective layer 61 may decrease in film stability and increase in removal rate in a subsequent cleaning process. The protective layer 61 may be formed to fill the void 42.

Figure 15D:
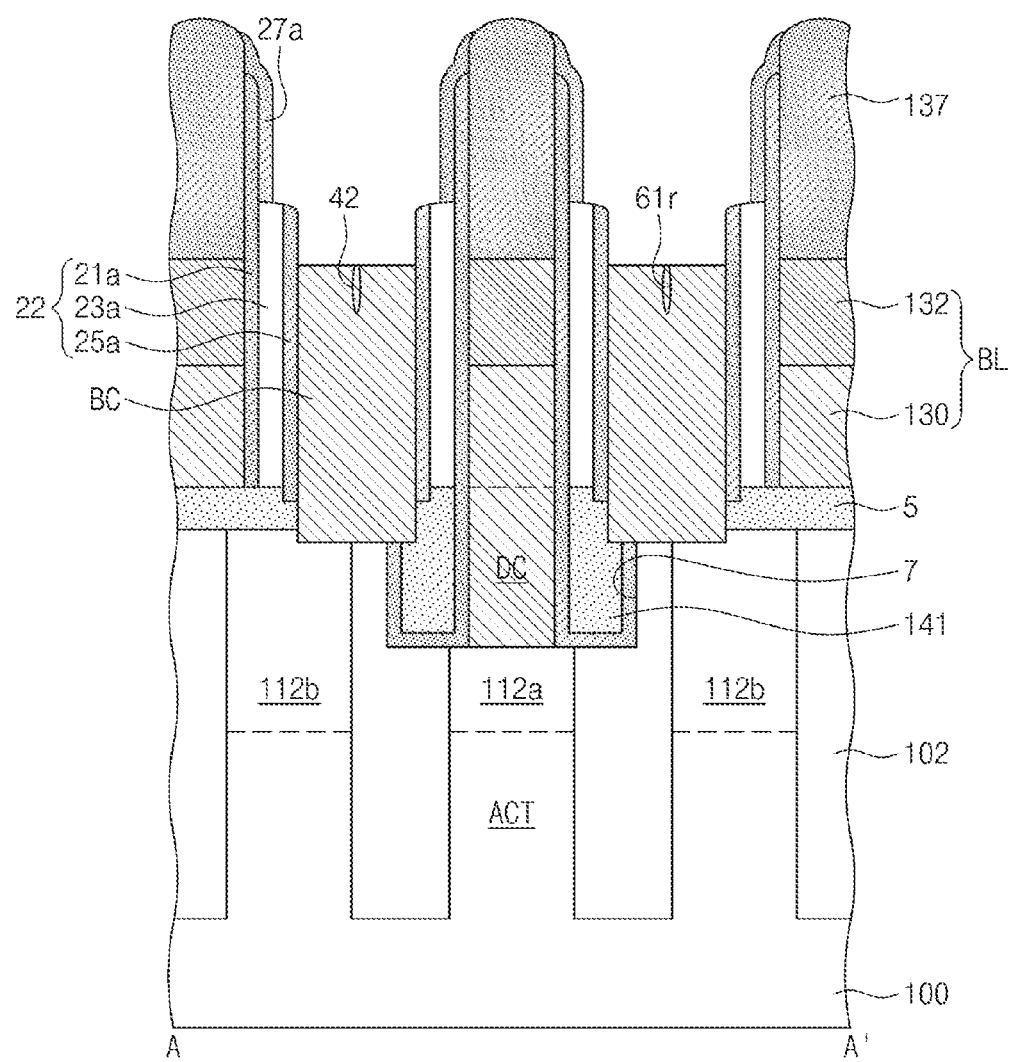

Referring to FIG. 15D, a cleaning process may be performed to remove the protective layer 61 and contaminants from the top surface of the storage node contact plug BC. The protective layer 61 may protect the etch-damaged third sub-spacer 25a during the cleaning process. For example, the protective layer 61 may limit and/or prevent the third sub-spacer 25a from being removed in the cleaning process. The first spacer 22 may thus be protected from damage on its sidewall, and thereby the bit line BL may be sufficiently insulated from the storage node contact plug BC. The void 42 may include therein a protective residue layer 61r consisting of (or including) a portion of the protective layer 61.

Subsequently, referring to FIGS. 7A to 7C, a metal layer such as a cobalt layer may be conformally formed on a surface of the storage node contact plug BC, and then an annealing process may be performed to form on the storage node contact plug BC a metal silicide layer, i.e., an ohmic layer 9. In this operation, since the protective residue layer 61r is formed of a polysilicon layer, the ohmic layer 9 may be perfectly formed. A removal may be performed on a remaining metal layer that has not been transformed into the ohmic layer 9.

When the protective layer 61 is formed of a material that is hardly removable and different from that of the storage node contact plug BC and when the void 42 is exposed on the upper portion of the storage node contact plug BC, the void 42 may include therein a material, such as a silicon layer, constituting the protective layer 61. In addition, there may be arisen a problem that a metal silicide layer is not formed on a silicon nitride layer when the ohmic layer 9 is formed in a subsequent process. It therefore may be impossible to obtain a perfect ohmic contact. However, according to example embodiments of present inventive concept, the ohmic contact may be formed better because the protective layer 61 is formed of a polysilicon layer the same as that of the storage node contact plug BC.

When the cleaning process is performed, a polysilicon layer constituting the protective layer 61 may exhibit a higher etching rate (or a higher removal rate) than that of a silicon nitride layer. In comparison with a case the protective layer 61 is formed of a silicon nitride layer, contaminants may be readily removed from the top surface of the storage node contact plug BC. As a result, an ohmic layer (see 9 of FIG. 15E) may be limited and/or prevented from being incompletely formed caused by contaminants possibly present on the top surface of the storage node contact plug BC.

Figure 15E:
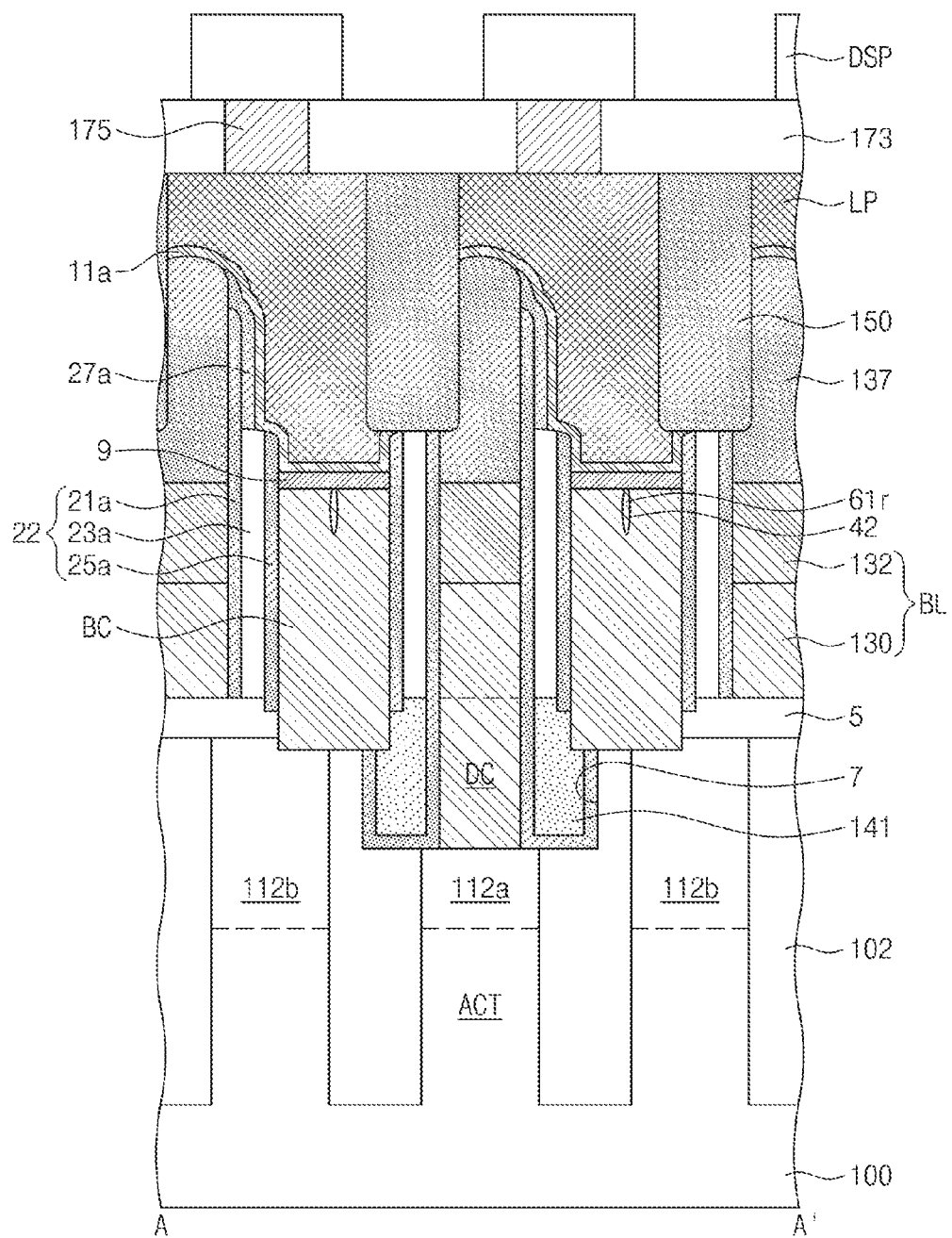

Referring to FIGS. 7A, 15A, and 7C, a metal layer such as a cobalt layer may be conformally formed on a surface of the storage node contact plug BC, and then an annealing process may be performed to form on the storage node contact plug BC a metal silicide layer, i.e., an ohmic layer 9. In this operation, since the protective residue layer 61r is formed of a polysilicon layer, the ohmic layer 9 may be perfectly formed. A removal may be performed on a remaining metal layer that has not been transformed into the ohmic layer 9. Subsequent processes may be identical or similar to those discussed with reference to FIGS. 7A to 7C. FIG. 15E may correspond to a cross-sectional taken along line A-A' of FIG. 7A according to example embodiments of inventive concepts.

According to example embodiments of inventive concepts, the ohmic layer may be perfectly formed on the storage node contact plug. Furthermore, the bit line may be stably protected, and a good insulation may be steadily maintained between the bit line and the storage node contact.

What is claimed is:

1. A method of fabricating a semiconductor memory device, comprising:
   forming a bit line and a bit line capping pattern on a semiconductor substrate, the bit line capping pattern on the bit line;
   forming a first spacer covering a sidewall of the bit line capping pattern and a sidewall of the bit line;
   forming a contact plug in contact with a sidewall of the first spacer, the contact plug having a top surface that is lower than an upper end of the first spacer, the contact plug including a void exposed on the top surface;
   removing an upper portion of the first spacer;
   forming a first sacrificial layer that blocks an entrance of the void;
   forming a second spacer covering the sidewall of the bit line capping pattern, the second spacer having a bottom surface in contact with a top surface of the first spacer; and
   removing the first sacrificial layer.

2. The method of claim 1, wherein
   the forming the first sacrificial layer includes forming the first sacrificial layer as an oxide layer, and
   the forming the first sacrificial layer includes,
   coating an entire surface of the semiconductor substrate with a solution including oxygen, and
   baking the solution.

3. The method of claim 1, further comprising:
   forming a first sacrificial spacer covering the sidewall of the bit line capping pattern, the first sacrificial spacer including a same material as that of the first sacrificial layer;
   forming a second sacrificial spacer covering a sidewall of the first sacrificial spacer, the second sacrificial spacer including a material exhibiting an etch selectivity to the first sacrificial spacer;
   removing the first sacrificial layer and an upper portion of the contact plug using the second sacrificial spacer as an etch mask; and
   removing the first sacrificial spacer and the second sacrificial spacer, wherein
   the forming the contact plug includes forming the contact plug of the same material as the first sacrificial layer, and
   the removing the first sacrificial layer is performed before the forming the second spacer.

4. The method of claim 3, further comprising:
   forming a third spacer when forming the second spacer, wherein
   the forming the first spacer includes forming a first sub-spacer covering the sidewall of the bit line and a second sub-spacer covering a sidewall of the first sub-spacer,
   the removing the first sacrificial layer and the upper portion of the contact plug includes partially exposing a sidewall of the second sub-spacer,
   the method further includes removing a portion of the second sub-spacer to partially expose the sidewall of the first sub-spacer, and
   the forming the third spacer includes forming the third spacer to cover the sidewall of the first sub-spacer that is partially exposed.

5. The method of claim 1, further comprising:
   forming a second sacrificial spacer covering a sidewall of the second spacer, the second sacrificial spacer including a same material as that of the first sacrificial layer; and
   removing the second sacrificial spacer, wherein
   the removing the second sacrificial spacer is performed simultaneously with the removing the first sacrificial layer, and
   the forming the first sacrificial layer includes forming the first sacrificial layer to fill the void.

6. The method of claim 1, further comprising:
forming a second sacrificial spacer covering a sidewall of the second spacer, the second sacrificial spacer exhibiting an etch selectivity to the second spacer, wherein
the removing the first sacrificial layer includes using the second sacrificial spacer as an etch mask, and
the first sacrificial layer is formed of a same material as that of the second spacer.

7. The method of claim 1, further comprising:
cleaning the top surface of the contact plug after forming the second spacer; and
forming an ohmic layer on the top surface of the contact plug after forming the second spacer.

8. The method of claim 7, before cleaning the top surface of the contact plug, further comprising:
conformally forming a protective layer on an entire surface of the semiconductor substrate,
wherein the cleaning the top surface of the contact plug includes removing the protective layer.

9. A method of fabricating a semiconductor memory device, comprising:
forming a bit line and a bit line capping pattern on a semiconductor substrate, the bit line capping pattern being on the bit line;
forming a first spacer covering a sidewall of the bit line capping pattern and a sidewall of the bit line, the first spacer including a first sub-spacer and a second sub-spacer;
forming a contact plug in contact with a sidewall of the first spacer, the contact plug having a top surface that is lower than an upper end of the first spacer;
removing an upper portion of the first spacer;
removing an upper portion of the contact plug to expose a sidewall of the second sub-spacer;
removing an exposed upper portion of the second sub-spacer to expose a sidewall of the first sub-spacer;
forming a second spacer covering the sidewall of the bit line capping pattern, the second spacer having a bottom surface in contact with a top surface of the first sub-spacer and spaced apart from the second sub-spacer; and
forming a third spacer covering the sidewall of the first sub-spacer.

10. The method of claim 9, further comprising:
forming a sacrificial spacer covering the sidewall of the bit line capping pattern,
wherein the forming the sacrificial spacer is performed after the removing the upper portion of the first spacer and before the forming the second spacer, and
the removing the upper portion of the contact plug includes using the sacrificial spacer as an etch mask.

11. The method of claim 9, further comprising:
removing an exposed upper portion of the first sub-spacer after removing the upper portion of the contact plug, wherein
the removing the upper portion of the first spacer includes removing an upper portion of the second sub-spacer to expose the sidewall of the first sub-spacer.

12. The method of claim 9, further comprising:
cleaning the top surface of the contact plug without forming a protective layer; and
forming an ohmic layer on the top surface of the contact plug, wherein
the cleaning the top surface of the contact plug and the forming the ohmic layer are performed after the forming the second spacer and after the forming the third spacer.

13. A method of fabricating a semiconductor memory device, comprising:
forming a bit line and a bit line capping pattern on a semiconductor substrate, the bit line capping pattern on the bit line;
forming a first spacer covering a sidewall of the bit line capping pattern and a sidewall of the bit line;
forming a contact plug in contact with a sidewall of the first spacer, the contact plug having a top surface that is lower than an upper end of the first spacer;
removing an upper portion of the first spacer;
removing an upper portion of the contact plug to expose an upper part of the sidewall of the first spacer;
forming a second spacer covering the sidewall of the bit line capping pattern, the second spacer having a bottom surface in contact with a top surface of the first spacer, the second spacer extending over the top surface of the first spacer and directly contacting the sidewall of the bit line capping pattern;
forming a protective layer covering at least the upper part of the sidewall of the first spacer; and
performing a cleaning process on the semiconductor substrate.

14. The method of claim 13, wherein
the forming the protective layer includes forming the protective layer as a spacer shape to cover the upper part of the sidewall of the first spacer, and
the forming the protective layer and the forming the second spacer are performed simultaneously.

15. The method of claim 13, wherein
the forming the protective layer includes forming the protective layer to extend and cover an entire surface of the semiconductor substrate, and
the protective layer includes one of a polysilicon layer, a silicon oxide layer, or a silicon nitride layer including boron, and
the performing the cleaning process includes completely removing the protective layer.

16. The method of claim 13, wherein the protective layer is formed of a same material as that of the contact plug.

17. The method of claim 16, wherein
the forming the protective layer includes filling a void in the contact plug with the protective layer, and
the void is in an upper part of the contact plug and exposed before the forming the protective layer.

18. The method of claim 17, wherein the performing the cleaning process includes leaving the protective layer remaining in the void on the upper portion of the contact plug after the cleaning process.

19. The method of claim 13, wherein
the removing the upper portion of the contact plug exposes a void in the contact plug, and
the forming the protective layer includes filling the void with the protective layer.

20. The method of claim 13, further comprising:
doping the protective layer with an impurity before the performing the cleaning process.

* * * * *